United States Patent
Stone et al.

(10) Patent No.: US 7,331,097 B2
(45) Date of Patent: Feb. 19, 2008

(54) METHOD OF MANUFACTURING A WORKPIECE CHUCK

(75) Inventors: William M. Stone, Lenox, MA (US); Robert Lopez, Boxford, MA (US)

(73) Assignee: Temptronic Corporation, Sharon, MA (US)

( * ) Notice: Subject to any disclaimer, the term of this patent is extended or adjusted under 35 U.S.C. 154(b) by 0 days.

(21) Appl. No.: 10/919,817

(22) Filed: Aug. 17, 2004

(65) Prior Publication Data

US 2005/0011768 A1    Jan. 20, 2005

Related U.S. Application Data

(60) Division of application No. 10/035,612, filed on Oct. 19, 2001, now abandoned, which is a division of application No. 09/473,099, filed on Dec. 28, 1999, now Pat. No. 6,328,096, which is a continuation-in-part of application No. 09/115,206, filed on Jul. 14, 1998, now Pat. No. 6,019,164, which is a continuation-in-part of application No. 09/001,893, filed on Dec. 31, 1997, now Pat. No. 6,073,681.

(51) Int. Cl.
*B23P 25/00* (2006.01)

(52) U.S. Cl. .............. 29/458; 29/527.2; 29/527.3; 29/281.1; 29/559; 29/743; 165/80.1; 269/21; 269/903

(58) Field of Classification Search ............ 29/527.3, 29/458, 527.2, 527.5, 559, 743, 281.1; 438/715; 156/345.53; 279/3; 165/80.1; 269/21, 903
See application file for complete search history.

(56) References Cited

U.S. PATENT DOCUMENTS

| | | | |
|---|---|---|---|
| 3,744,560 A | 7/1973 | Sell, Jr. | 165/185 |
| 3,976,288 A | 8/1976 | Cuomo, Jr. | 269/21 |
| 4,153,107 A | 5/1979 | Antonetti et al. | 165/185 |
| 4,205,835 A | 6/1980 | Gerber | 269/289 |
| 4,403,567 A | 9/1983 | daCosta et al. | 118/500 |
| 4,462,462 A | 7/1984 | Meagher et al. | 165/80 |
| 4,607,220 A | 8/1986 | Hollman | 324/158 F |
| 4,675,242 A | 6/1987 | Hashimoto et al. | 428/131 |

(Continued)

FOREIGN PATENT DOCUMENTS

DE        142406        6/1980

(Continued)

*Primary Examiner*—Jermie E. Cozart
(74) *Attorney, Agent, or Firm*—Mills & Onello LLP

(57) ABSTRACT

A workpiece chuck includes an upper assembly on which can be mounted a flat workpiece such as a semiconductor wafer. A lower assembly is mountable to a base that supports the chuck. A non-constraining attachment means such as vacuum, springs or resilient washers applied to the chuck holds the upper assembly to the lower assembly, the lower assembly to the base and can hold the wafer to the top surface of the upper assembly. By holding the chuck together by non-constraining means, the chuck layers can move continuously relative to each other under expansion forces caused by temperature effects, such that mechanical stresses on the chuck and resulting deformation of the chuck and workpiece over temperature are substantially eliminated. A plurality of support members including inclined surfaces provided between an upper and lower portion of the chuck maintain the top surface of the chuck and any workpiece mounted thereon at a constant height over temperature.

3 Claims, 14 Drawing Sheets

U.S. PATENT DOCUMENTS

| | | | |
|---|---|---|---|
| 4,682,857 A | 7/1987 | Tan | 350/331 T |
| 4,734,872 A | 3/1988 | Eager et al. | 364/557 |
| 4,781,244 A | 11/1988 | Kuramitsu et al. | 165/80.4 |
| 4,884,026 A | 11/1989 | Hayakawa et al. | 324/158 F |
| 4,893,914 A | 1/1990 | Hancock et al. | 350/530 |
| 4,993,359 A | 2/1991 | Lewis et al. | 118/717 |
| 5,028,989 A | 7/1991 | Naganuma et al. | 357/82 |
| 5,033,538 A | 7/1991 | Wagner et al. | 165/80.1 |
| 5,034,688 A | 7/1991 | Moulene et al. | 324/158 F |
| 5,213,349 A | 5/1993 | Elliott | 279/128 |
| 5,223,113 A | 6/1993 | Kaneko et al. | 204/298.33 |
| 5,281,794 A | 1/1994 | Uehara et al. | 219/243 |
| 5,316,276 A | 5/1994 | Heinle | 269/21 |
| 5,423,558 A | 6/1995 | Koeth et al. | 279/3 |
| 5,567,267 A | 10/1996 | Kazama et al. | 156/345 |
| 5,578,532 A | 11/1996 | van de Ven et al. | 437/245 |
| 5,610,529 A | 3/1997 | Schwindt | 324/760 |
| 5,651,268 A | 7/1997 | Aikawa et al. | 62/525 |
| 5,671,910 A | 9/1997 | Davies et al. | 269/21 |
| 5,679,404 A | 10/1997 | Patten, Jr. et al. | 427/248.1 |
| 5,688,331 A | 11/1997 | Aruga et al. | 118/725 |
| 5,738,165 A | 4/1998 | Imai | 165/80.2 |
| 5,810,933 A | 9/1998 | Mountsier et al. | 118/724 |
| 5,835,334 A * | 11/1998 | McMillin et al. | 361/234 |
| 5,904,807 A | 5/1999 | Ramm-Schmidt et al. | 159/43.1 |
| 6,019,164 A | 2/2000 | Getchel et al. | 165/80.1 |
| 6,068,730 A | 5/2000 | Ramm-Schmidt et al. | 159/43.1 |
| 6,073,681 A | 6/2000 | Getchel et al. | 165/80.1 |
| 6,090,212 A | 7/2000 | Mahawili | 118/728 |
| 6,104,203 A | 8/2000 | Costello et al. | 324/760 |
| 6,120,608 A | 9/2000 | Shendon et al. | 118/728 |

FOREIGN PATENT DOCUMENTS

| | | |
|---|---|---|
| EP | 0743530 | 11/1996 |
| EP | 0827187 | 3/1998 |
| FR | 2668969 | 11/1990 |
| JP | 58-173392 | 10/1983 |
| WO | 99/34159 | 7/1999 |

* cited by examiner

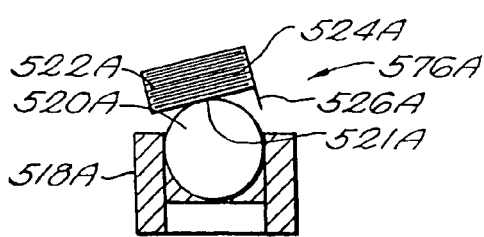
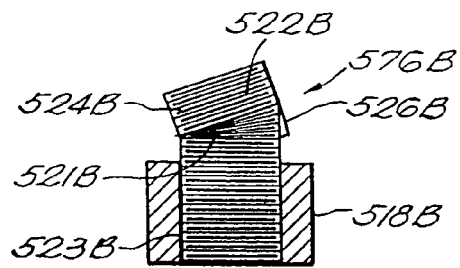
FIG. 10A  FIG. 10B
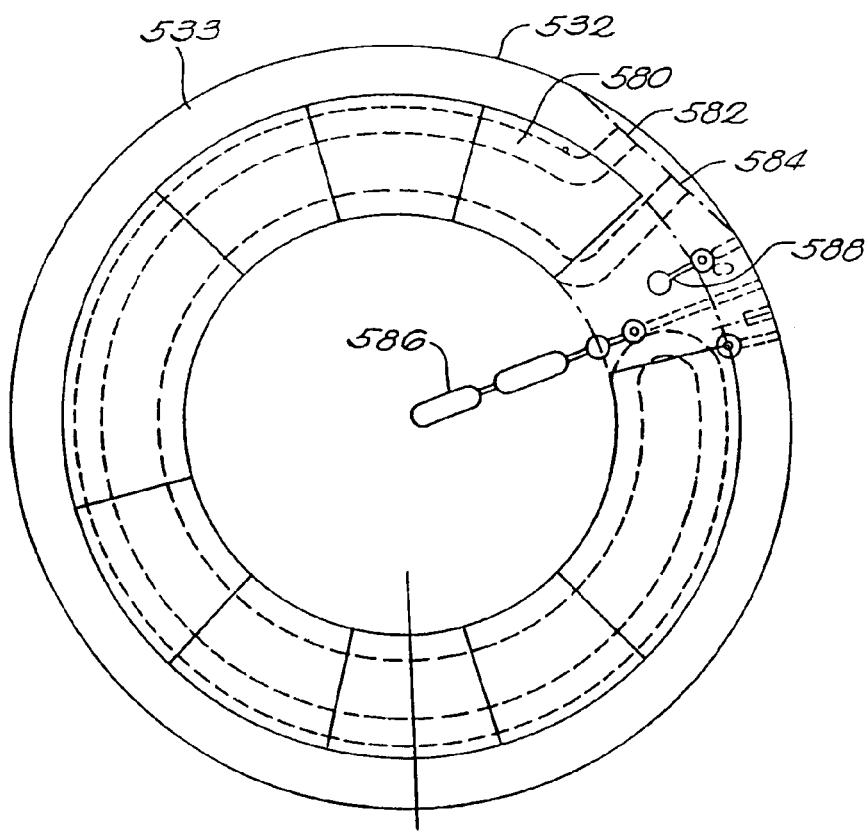
FIG. 11A
FIG. 11B

METHOD OF MANUFACTURING A WORKPIECE CHUCK

RELATED APPLICATIONS

This application is a divisional of U.S. patent application Ser. No. 10/035,612, filed Oct. 19, 2001, now abandoned, which is a divisional of U.S. patent application Ser. No. 09/473,099, filed on Dec. 28, 1999, now issued U.S. Pat. No. 6,328,096, which is a continuation-in-part of U.S. patent application Ser. No. 09/115,206, filed on Jul. 14, 1998, now issued U.S. Pat. No. 6,019,164, which is a continuation-in-part of U.S. patent application Ser. No. 09/001,893, filed on Dec. 31, 1997, now issued U.S. Pat. No. 6,073,681. The contents of these applications and patents are incorporated herein in their entirety by reference.

FIELD OF THE INVENTION

The present invention relates generally to chucks used to hold flat workpieces and specifically to chucks which hold workpieces such as semiconductor wafers and control the temperature of the workpieces.

BACKGROUND OF THE INVENTION

In the semiconductor integrated circuit industry, the cost of individual integrated circuit chip die is continuing to decrease in comparison to IC package costs. Consequently, it is becoming more important to perform many IC test and evaluation steps while the die are still in the wafer, rather than after the relatively expensive packaging steps have been performed.

Increasingly, in IC processing, semiconductor wafers are subjected to a series of test and evaluation steps. For each step, the wafer is held in a stationary position at a process station where the process is performed. For many processes, it is important that the wafer be held extremely flat. For example, circuit testing is typically performed over a wide temperature range to temperature screen the ICs before assembly into a package. The wafer is typically held on a vacuum platform of a host test machine such as a probing station which electrically tests the circuits on the wafer. The prober includes a group of electrical probes which, in conjunction with a tester, apply predetermined electrical excitations to various predetermined portions of the circuits on the wafer and sense the circuits' responses to the excitations. To ensure that proper electrical contacts are made and to ensure that the mechanical load applied by the probes to the wafer is known and uniform, it would be beneficial to keep the wafer extremely flat and also to maintain the top surface of the chuck, on which the wafer rests, at a constant height.

In a typical prober system, the wafer is mounted on the top surface of a wafer chuck, which is held at its bottom surface to a support structure of the prober. A vacuum system is typically connected to the chuck. A series of channels or void regions in communication with the top surface of the chuck conduct the vacuum to the wafer to hold it in place on the top surface of the chuck. The prober support structure for the chuck is then used to locate the wafer under the probes as required to perform the electrical testing on the wafer circuits.

To allow for temperature screening of the wafer circuits, the chuck can also include a heater for heating the wafer to a desired temperature and a heat sink for cooling the wafer as needed. The prober system in conjunction with the chuck can then be used to analyze performance of the wafer circuits at various temperatures within a predetermined temperature range.

During temperature transitioning, the various components of the chuck tend to change size and shape due to thermal expansion and contraction effects of chuck materials over temperature. Portions of the chuck which have different thermal expansion coefficients expand and contract at different rates over temperature. Also, expansion and contraction of the chuck in the vertical direction can cause variation in the height at which the workpiece is supported during testing, thus introducing additional variables into the testing procedure.

Conventional wafer chucks are formed from multiple components fastened together. For example, a typical chuck can include a lower plate or support for mounting to the prober, a heat sink over the lower plate, a heater over the heat sink and an upper plate or support assembly on which the wafer can be held, the upper plate including the vacuum channels used to conduct the vacuum to the top surface. In conventional chucks, all of these layers are typically held together by bolts, rivets, etc., or other rigid, inflexible mechanical fastening means. Furthermore, the chuck is typically held to the base of the host machine by similar rigid means.

These conventional means for holding the chuck together and holding the chuck to the base introduce mechanical stresses into the chuck structure. When the chuck is subjected to variations in temperature, these stresses tend to cause the chuck to deform, resulting in a loss of flatness of the wafer. The non-flat upper surface of the wafer can introduce inaccuracies into the circuit performance measurements performed by the prober.

The deformation in the chuck is typically caused by different chuck layers having different thermal expansion coefficients, such that, over temperature, different layers will experience different thermal expansion forces. Because the chuck layers are held together rigidly, the difference in forces causes the chuck to warp. As the chuck deforms, expansion forces build-up in the chuck. In most chucks, the clamping forces holding the layers together are sufficient to resist relative radial movement between the layers, and the warp increases. In some chucks, the clamping forces are such that, periodically, they are overcome by the expansion forces, and layers move rapidly in a jerking motion relative to each other to relieve the built-up stresses. This rapid "popping" motion is highly unpredictable and can introduce substantial wafer shape and/or location errors. Also, because the clamping forces are so high in these systems, the chuck layers are not relieved all the way back to a zero-expansion condition. So, in general, there is always some undetermined amount of deformation in the chuck over temperature. The "popping" motion can also introduce bursts of electrical noise caused by the sudden movement of the surfaces over each other. This is also undesirable.

It will be appreciated that these effects caused by the conventional mechanically constrained chuck assembly are magnified for larger diameter chucks. That is, the stresses introduced in clamping or bolting together a large diameter chuck are greater than those introduced in assembling a small diameter chuck. Larger chucks therefore tend to deform more over temperature than do smaller chucks. Therefore, using conventional wafer chuck techniques, it is becoming increasingly more difficult to hold wafers flat over temperature as wafer diameters continue to increase.

Conventional wafer chucks used for temperature cycling and/or transitioning are typically mounted on the prober support structure in a manner which provides for good thermal conduction between the chuck and the prober support structure. In these systems, large amounts of energy dedicated to temperature cycling and/or transitioning of the wafer can be lost in the form of heat flow between the prober and the chuck. Also, temperature variations in the prober support structure can cause spatial shifts in the wafer which can cause inaccuracies in the prober circuit testing.

OBJECTS OF THE INVENTION

It is an object of the invention to provide a workpiece chuck in which the foregoing disadvantages of prior devices are substantially eliminated.

It is a more specific object of the invention to provide a workpiece chuck for supporting a workpiece which maintains the workpiece substantially flat over a wide range of temperature variations.

It is another object of the invention to provide a workpiece chuck which is held together in a stiff but mechanically non-constrained fashion such that thermal and mechanical stresses in the chuck are reduced.

It is another object of the invention to provide a workpiece chuck which is held to the support structure of a host machine such as a wafer prober machine by a stiff but mechanically non-constrained means, such as vacuum or springs.

It is still another object of the invention to provide a workpiece chuck on which large-diameter semiconductor wafers can be supported and maintained flat during electrical probe testing over a wide range of temperatures.

It is yet another object of the invention to provide a workpiece chuck for supporting a semiconductor wafer, the workpiece chuck being mountable on a base and including means for heating and cooling the semiconductor wafer while maintaining the base at or near an ambient temperature.

It is yet another object of the invention to provide a workpiece chuck for supporting a semiconductor wafer and mountable on a base and including means for heating and cooling the semiconductor wafer, the workpiece chuck providing thermal isolation between the workpiece chuck and the base such that the workpiece chuck exhibits improved energy efficiency.

It is yet another object of the invention to provide a workpiece chuck in which a top surface of the workpiece chuck is maintained at a substantially constant height over temperature.

SUMMARY OF THE INVENTION

These and other objects of the invention are realized by a chuck apparatus and method for holding a workpiece in accordance with the invention. The chuck of the invention includes an upper support or assembly on which the workpiece or wafer can be mounted and a lower support or assembly by which the chuck can be mounted to a base such as the support structure of a host machine such as a wafer prober. In general, the upper support is characterized by a first temperature and the lower support is characterized by a second temperature. The chuck also includes non-constraining attachment means which holds the upper and lower supports together and holds the lower support and the base together while allowing substantially continuous relative movement between layers of the chuck caused by thermal expansion forces due to differential temperature effects between the upper support, lower support and the base. By using non-constraining attachment means, such as vacuum or springs or spring washers such as belleville washers which are not clamped with sufficient force to completely constrain the chuck layers against radial movement relative to each other, the mechanical stresses found in the rigidly assembled chucks of prior systems are eliminated. The relative movement between layers is substantially continuous in that the rapid jerking or popping motion of prior systems is eliminated by using the non-constraining attachment means.

In one embodiment, the upper assembly can include a substrate made of an insulating material. In one particular embodiment, the insulating material is a ceramic. Where vacuum wafer attachment is used, the substrate can be formed with a vacuum distribution pattern on its top surface for holding the wafer in place. The substrate can be provided with one or more vacuum ports for applying the vacuum to the upper assembly and can include inner channels or void regions connecting the vacuum ports with the pattern on the top surface, or it can be provided with holes through the substrate and metallic surfaces, if any, above and below the substrate to vacuum ports in a lower support or assembly.

The vacuum distribution pattern on the top surface can be a "waffle" pattern which includes a rectangular array of raised rectangular regions separated by narrow channels along the surface through which the vacuum is distributed to hold down the wafer. In this configuration, the bottom surface of the wafer rests on the top surfaces of the raised rectangular regions.

The vacuum distribution pattern on the top surface can be formed on the top surface by one of several processes. In one approach, the pattern of channels or "streets" is ground into the ceramic substrate and may then be coated with a layer of metal if electrical contact to the back side of the wafer is desired. In another embodiment, a uniform layer of metal is deposited onto the top surface of the substrate, and then a pattern of channels is etched into the metal, leaving a pattern of raised rectangular metallic pads. In another embodiment, the raised regions are formed by depositing the array of rectangular metallic pads onto the ceramic substrate, leaving the channels between the pads. To provide electrical conduction between the chuck and the wafer, a thin layer of metal can be added on top of the patterned vacuum distribution layer. Any of the metallic layers can be deposited by a silk screening process, or other process such as plating, sputtering, brazing, etc., or a combination thereof. During circuit testing, to improve the sensitivity of a measurement, it is sometimes desirable to reduce electrical current leakage between the wafer under test and ground. To that end, the substrate in the chuck of the invention can include an electrical guard assembly layer contacting its bottom surface. In one embodiment, the guard layer includes a layer of metal contacting the bottom surface of the substrate and connected to a terminal to allow for external electrical access. To reduce leakage or capacitance effects in the substrate, a signal approximately identical to the excitation signal being applied to the circuit under test is applied to the guard layer. By thus maintaining the upper and lower surfaces of the substrate at the same potential, leakage currents through the substrate are substantially reduced or eliminated. In one embodiment, the guard layer includes an insulating surface below it which permits a signal approximately identical to the excitation signal being applied to the circuit under test to be applied to the guard layer.

Where the upper and lower assemblies are held together by vacuum, the bottom surface of the upper assembly can be formed with another vacuum distribution pattern which may be produced by any of the means by which vacuum patterns can be formed on the top surface of the substrate. The pattern can define plural concentric raised portions with concentric annular vacuum distribution regions between them. The guard layer can be held to the upper assembly by this lower vacuum distribution pattern in the upper assembly or by a vacuum pattern in the guard layer itself.

In one embodiment, the electrical guard assembly includes multiple layers of conductors separated by insulators. In one particular embodiment, the assembly includes three conductive metallic layers, with each pair of conductive layers being separated by an insulating layer which, in one embodiment, is made of polyimide. The top conductor layer, as mentioned above, can be patterned to distribute vacuum over its surface to hold it to the bottom of the upper assembly. The middle layer can be a near-uniform conductive layer which serves as the actual electrical guard. Contact can be made to the middle layer to apply the excitation signal to the guard. The bottom layer can be another near-continuous layer used as a holding layer for vacuum which holds the guard assembly to the lower assembly of the chuck.

In one embodiment, two vacuum systems are used to operate the chuck. One vacuum system holds the chuck together and a second system holds the wafer on the top of the chuck. The guard assembly can include both the patterned layer for distributing vacuum of the first vacuum system across its surface to hold the chuck together as well as a pattern of holes for transferring vacuum of the second vacuum system to the top of the chuck to hold the wafer.

The lower assembly can include a heater and a heat sink for heating and cooling the wafer. In one embodiment, the heat sink is located above the heater and, hence, closer to the wafer to provide more efficient heat flow into the heat sink during cooling. The heater can be attached to the bottom surface of the heat sink by one of many techniques, one of which is to directly vulcanize it to the heat sink, another of which involves bonding the heater to the heat sink using epoxy. In another embodiment, the heat sink includes a housing which is cast from a material such as aluminum. The heater can be mounted within the cast housing.

The heat sink can include tubing through which fluid flows. The tubing can be formed as a spiral intake with a reverse spiral outlet, with intake tubing adjacent to outlet tubing to provide efficient and uniform removal of heat from the heat sink. In one embodiment, the tubing can be flattened such that the height of the heat sink and, consequently, the overall height of the chuck, can be reduced. Round tubing can be at least partially flattened such as by pressing the tubing and then placed in the heat sink housing. In one embodiment, fluid can also flow through the bottom of the lower assembly to maintain an ambient temperature barrier between the chuck and the base to prevent heat flow between the chuck and the base.

In one embodiment, the heat sink is formed from a casting made of a material such as aluminum. Because of the non-constraining attachment of the invention, components of the chuck above the heat sink can move laterally with respect to the heat sink. Layers in direct contact with the top of the heat sink tend to rub the aluminum casting. This can tend to coat the layer on top of the casting with aluminum, particularly at high temperatures when the aluminum is relatively soft. To eliminate this effect, the top surface of the heat sink casting can be plated or coated with a hard surface to seal the top of the casting. This plating can be a hard anodize, e.g., hard black anodize. The use of such a material also contributes to the electrically isolating qualities of the chuck.

The upper and lower assemblies can be aligned with each other by one or more alignment pins. In one embodiment, the alignment pins are pressed into the lower assembly and protrude through the top surface of the lower assembly. When the upper and lower assemblies are brought together, the alignment pins mate with alignment holes in the bottom surface of the upper assembly. In one embodiment, one of the alignment holes, which can be located at the center of the chuck, is round and is sized to provide a slip fit with its associated alignment pin. Another hole can be elongated to provide a slip fit with a pin in one direction and to allow motion of the pin in the orthogonal radial direction. This configuration allows for relative expansion and contraction of parts while preventing relative rotation.

The present invention provides thermal isolation between the chuck and the base while also providing adequate mechanical support for the mechanical load on the wafer, such as that due to forces exerted by the probes or probe array of the prober. The lower assembly includes a lower support plate to which the heat sink can be mounted. The heat sink can rest on a plurality of thermally insulating elements located between the bottom of the heat sink and the top of the lower support plate. The elements can be in the shape of posts, rods, cylinders or spherical balls in any spatial orientation including upright or lying down, and can be made of a thermally insulating material such as glass, ceramic, etc. The elements provide thermal isolation and mechanical support within the lower assembly of the chuck. The number of elements and their locations can be selected based on a desired chuck stiffness. For reasonable stiffness of larger diameter chucks, more than three elements, which are sufficient to define a plane, can be used. For this reason, a plurality of elements which have very close-tolerance heights can be used.

The bottom of the heat sink can also be equipped with a vacuum seal such that the chuck can be vacuum mounted to the base. A ring can be mounted to the bottom of the heat sink. The ring can include the required seal, e.g., o-rings, to seal the bottom of the chuck to the base. The ring can also include openings through which additional elements can pass to support the chuck on the base while also providing thermal isolation.

In another aspect, the present invention is directed to a workpiece chuck containing any of the previously mentioned features and also maintaining the height of the chuck at a substantially constant height over temperature. The chuck includes an upper portion on which the workpiece can be mounted and a lower portion by which the chuck can be mounted to a base, such as the base of an integrated circuit or wafer prober machine. The chuck includes a plurality of support members between the upper portion and lower portion of the chuck for supporting the upper portion over the lower portion. Each of the support members includes an inclined surface mounted in fixed relation to one of the upper and lower portions and a mating contact surface mounted in fixed relation to the other of the upper and lower portions. Within each support member, the contact surface is maintained in contact with its mating inclined surface. As the shape of at least one of the upper and lower portions changes, such as through the effects of temperature transitioning, the contact surface of a support member moves along its associated inclined surface in contact with the contact surface.

In one embodiment, the inclined surface of the support member is mounted to the upper portion of the chuck, and the mating contact surface is mounted to the lower portion of the chuck. In another embodiment, the inclined surface is mounted to the lower portion of the chuck, and the mating contact surface is mounted to the upper portion. The angle of incline of the inclined surface of each support member is selected such that as the upper portion of the chuck expands or contracts with temperature, the top surface of the upper portion and, consequently, the workpiece, are kept at a substantially constant height. To illustrate, if the temperature of the chuck increases, the upper portion of the chuck tends to expand in both the horizontal and vertical directions. As it expands vertically, the height of the top surface of the chuck and the workpiece would tend to rise, thus introducing errors into the measurement procedure being performed. However, in accordance with the invention, as the upper portion also expands in the horizontal dimension, the inclined surfaces in the upper (or lower) portion slide along the contact surfaces in the lower (or upper) portion to lower the lower side of the upper portion sufficiently to compensate for the increase in height caused by expansion of the upper portion in the vertical dimension. The angle of incline is selected such that the combined vertical and horizontal expansion results in substantially constant workpiece height.

In one embodiment, three support members are used to provide stability to the chuck to prevent tilting of the upper portion of the chuck. In another embodiment, additional support members can be used to provide additional support where needed, such as when the chuck is operated at high temperatures at which one or more chuck components may tend to soften. In this embodiment, the additional support members can be sized to allow the ambient three-point planar support configuration to provide the main support for the chuck. Then, under different conditions, such as at high temperature or under relatively high vertical compressive loads, the additional support members can provide any additional support needed due to various movements or changes in shape of any chuck components.

In one embodiment, the inclined surfaces and the contact surfaces are made of a hardened material and/or a thermally insulating material, such as tungsten carbide. The inclined surfaces can be flat, and the contact surfaces can be rounded or flat. Specifically, a contact surface can be the surface of a spherical ball. Alternatively, the contact surface can be a flat formed on a spherical ball or a flat end of a thermally insulating support rod. The hard material prevents deformation or damage of the inclined surfaces and contact surfaces over wide temperature extremes.

The region in which the support members are located defines a chamber between the upper and lower portions of the chuck. In one embodiment, air or other fluid can be circulated through this chamber to keep the support members relatively cool, to reduce the effects of the required temperature extremes on the support members. As a result of the reduced temperature effects on the support members, different materials can be used for the inclined surfaces and the contact surfaces. For example, the surfaces can be made of highly polished silicon nitride or alumina which can provide extremely smooth movement and electrical isolation. The chamber enclosure can be made of a low emissivity material such as stainless steel to provide a highly reflective outside surface to provide thermal reflection. The enclosure can also serve as an EMI shield for the chuck and components under test.

The constant height aspect of the invention provides advantages over prior systems in which thermal expansion and contraction of the chuck introduce errors into procedures being performed to test semiconductor wafers, such as electrical circuit probing during temperature transitioning. In the present invention, because substantially constant wafer height is maintained, the mechanical load on the chuck and wafer can be more carefully controlled at an acceptable level. Also, probe contact can be insured since the height of the wafer does not change over temperature. This results in reduced error in circuit probing measurements.

A temperature control system that can be used to control temperature of the chuck and workpiece in accordance with the present invention is described in copending U.S. patent application Ser. No. 09/001,887, now issued U.S. Pat. No. 6,415,858, entitled "Temperature Control System for a Workpiece Chuck," filed on Dec. 31, 1997 and assigned to the same assignee as the present application. An electrical control system which can be used in connection with the chuck of the present invention is described in copending U.S. patent application Ser. No. 09/001,927, now issued U.S. Pat. No. 6,091,060, entitled "Power and Control System for a Workpiece Chuck," filed on Dec. 31, 1997 and assigned to the same assignee as the present application. Both of those copending patent applications are incorporated herein in their entirety by reference.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 10A-10B are schematic pictorial views of two alternative embodiments of the support member used to support the upper portion of the chuck of FIG. 9A in accordance with the present invention.

FIG. 11A is a schematic top view of a heat sink assembly in accordance with the present invention.

FIG. 11B is a schematic view which pictorially illustrates the cross-section of coolant tubes used in one embodiment of the heat sink of FIG. 11A.

DETAILED DESCRIPTION OF THE DRAWINGS

Figure 1:
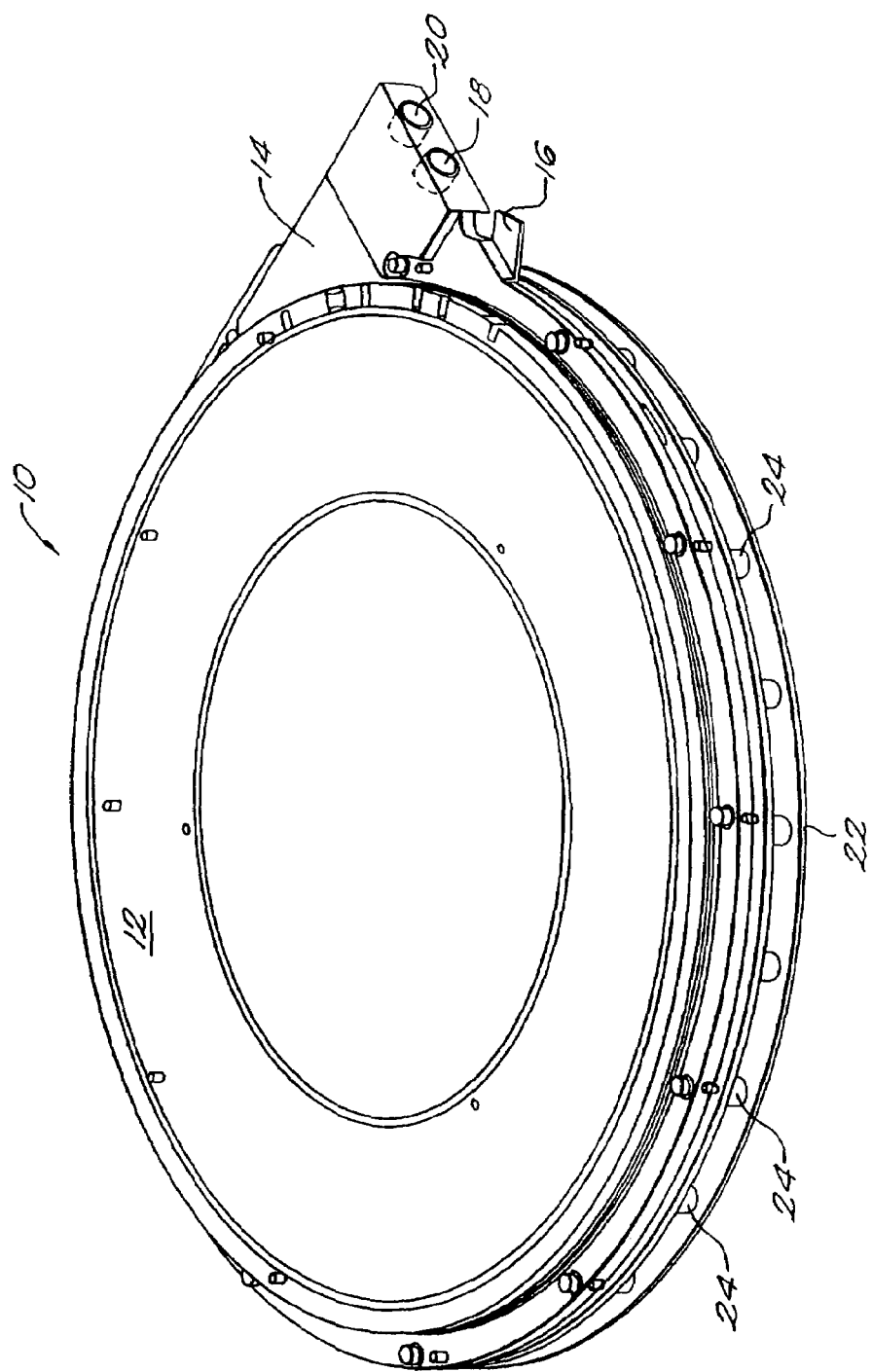
FIG. 1 is a schematic perspective view of one embodiment of a workpiece chuck in accordance with the present invention.

FIG. 1 is a schematic perspective view of one embodiment of the workpiece chuck 10 of the invention. The chuck 10 includes a top surface 12 on which a semiconductor wafer can be mounted. In one embodiment, the top surface 12 is formed with a vacuum distribution pattern as described below to distribute vacuum along the bottom surface of the wafer and thus hold the wafer to the chuck 10. The chuck 10 also includes a heat sink 14 used to remove heat from the wafer being processed. Ports 18 and 20 allow for circulation of a cooling fluid within the heat sink 14. The chuck 10 also includes a heater 16 attached to the bottom surface of the heat sink 14. As described below in detail, the chuck 10 also includes a lower insulating plate 22 over a base 48 which can be mounted to a host machine such as a prober machine. The components of the chuck 10 are mechanically supported over the support plate 22 by a plurality of thermally insulating supporting elements such as rods 24 which can be made of glass or other insulating material.

The chuck 10 is held together by some non-constraining attachment means described below in detail which provides clamping force sufficient to hold the chuck together during accelerations introduced by the host machine during positioning of the chuck 10. At the same time, the attachment means holds the chuck in a non-constraining fashion such that lateral forces due to thermal expansion effects can overcome the clamping forces such that layers of the chuck 10 can move substantially continuously relative to each other under thermal expansion forces.

Figure 2:
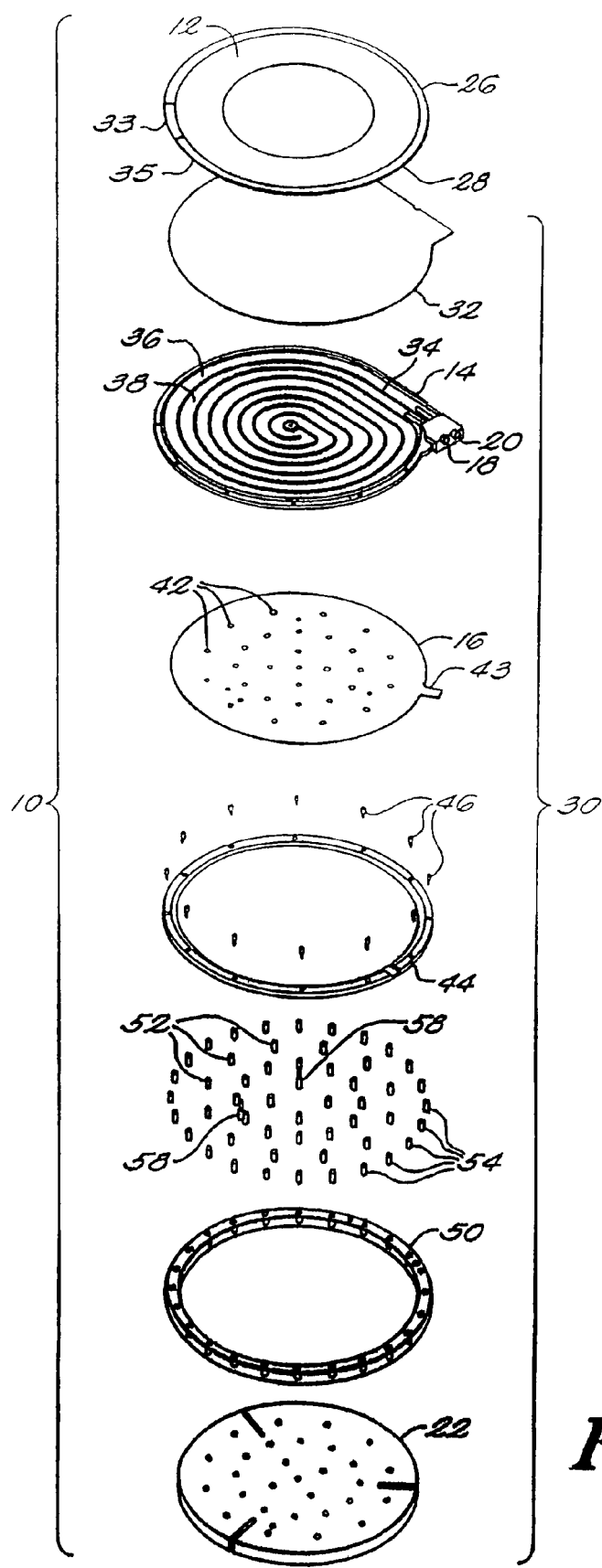
FIG. 2 is a schematic exploded view of one embodiment of the chuck of the invention using vacuum to hold the chuck together.
Figure 3:
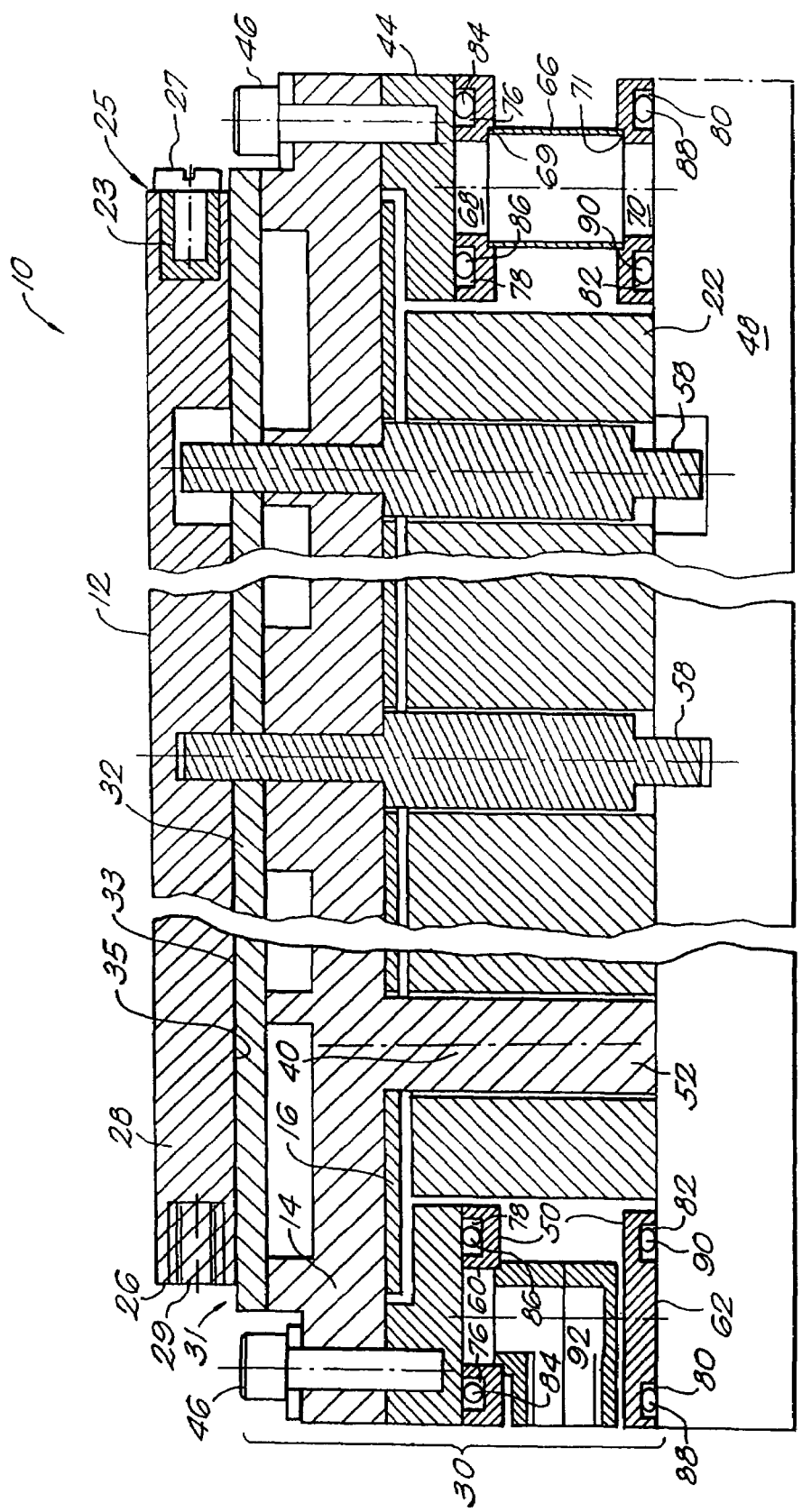
FIG. 3 is a schematic cross-sectional view of the chuck of FIG. 2 using vacuum to hold the chuck together.

FIG. 2 is a schematic exploded view of one embodiment of the workpiece chuck 10 of the invention using vacuum to hold the chuck together, and FIG. 3 is a schematic cross-sectional view of the chuck 10 of FIG. 2. Referring to FIGS. 2 and 3, the chuck 10 includes an upper assembly or support 26 which includes the patterned top surface 12 which includes a vacuum distribution pattern for distributing vacuum to the bottom surface of the wafer to hold the wafer to the chuck. The top surface 12 is formed over an insulating substrate 28 which can be formed from a ceramic material such as aluminum nitride, alumina or similar material. A top metallization layer can be formed over the vacuum distribution pattern to allow for good electrical contact between the wafer under test and the chuck 10. The metallization layer can be sputtered onto the top surface and over a side of the substrate 28 such as at 25. Electrical connection can be made to the metallization layer, for example, with a wire and lug fastened by a screw or stud 27 inserted into hole 23 and contacting the metal along the side of the assembly 26. Because in this embodiment the upper assembly is attached to lower chuck components by vacuum, the bottom surface of the ceramic substrate 28 can also be formed with a vacuum distribution pattern.

A metallic layer 33 can be placed in contact with the bottom surface of the substrate. When this metallic layer has an insulating layer 35 on its underside, the metallic layer forms a conductive guard used to eliminate capacitively coupled noise effects during testing. A signal substantially identical to the excitation signal being used to test a circuit is also applied to the guard. By keeping the wafer and the guard at the same potential, leakage through the substrate 28 is reduced. Connection can be made to the guard 33 by forming a portion of the guard 33 along the side of the substrate such as at 31. A conductive element can be attached to the guard by directly brazing it or by inserting a stud or connector into a hole 29 in the substrate 28 to make contact. If a guard layer is inserted, an insulation layer 35 would be formed under the guard layer to prevent electrical conduction into the lower components of the chuck 10. In other embodiments the guard 33 would be omitted.

The remaining components in FIGS. 2 and 3 form a lower assembly or lower support 30 of the chuck 10. The lower assembly 30 includes the heat sink 14 which is covered by a thermally conductive cap 32 made of a material such as aluminum or copper or other conductive material suitable to the temperature range of operation. The cap 32 can be attached to the top of the heat sink 14 by oven brazing or other attachment process.

The heat sink 14 can include a pair of channels which carry fluid in a spiral fashion through the heat sink. An inlet channel 36 receives the fluid from the inlet port 20 and an outlet channel 38 carries the fluid out of the heat sink 14 via the outlet port 18. The channels are separated by a wall 34, which, when the cap 32 is attached to the top of the heat sink 14, separates the channels 36 and 38. Fluid entering the heat sink 14 is carried in a spiral fashion into a central region at the center of the heat sink 14 and then into the outlet channel 38 which returns the fluid to the outlet port 18.

The maximum temperature differential between inlet fluid and outlet fluid occurs at the ports 18 and 20. The return-spiral configuration spreads the total temperature differential such that the temperature is maintained more uniform across the wafer than it would be if the cooling fluid were removed at the center of the spiral. That is, if the fluid were removed at the center of the heat sink, then the entire temperature differential would be applied across the wafer from its edge to its center. In the present invention, the temperature differential between inlet and return is maintained where the channels are adjacent to each other, with the lowest differential existing where the adjacent channels intersect at the center of the heat sink and the highest differential existing where the channels connect to the ports 18 and 20.

The bottom surface of the heat sink 14 can be formed with a plurality of studs or pegs 40 which can be used to support the heat sink. The lower assembly 30 of the chuck 10 can also include a heater 16 attached to the bottom of the heat sink 14. The heater 16 is formed with a pattern of clearance holes 42 which allow the studs 40 to pass through the heater 16 when the heater 16 and heat sink 14 are attached to each other. The heater can be a resistive foil heater and it can be adhered to the bottom surface of the heat sink 14 such as by a vulcanizing process or by epoxy bonding. The electrical connection is made to the heater 16 via a tab 43 which protrudes out of the chuck from the edge of the heater.

Adhering the heater 16 to the heat sink 14 provides intimate contact between them such that heat can be quickly and efficiently conducted through the conductive body of the heat sink 14 and its conductive cap 32 up to the workpiece. The vulcanization process involves applying an adhesive to the heat sink 14 and/or heater 16 and attaching the two using the adhesive. Next, the attached heater and heat sink are subjected to heating under pressure to cure the adhesive. The result is good thermal conduction between the heater 16 and the heat sink 14.

The lower support assembly 30 can also include an upper vacuum platform ring 44 which can be attached by bolts 46 to the bottom of the heat sink 14 around the circumference of the heat sink 14 as shown. The upper vacuum platform ring 44 is used in conjunction with a lower vacuum attachment ring 50 as part of a vacuum attachment assembly which attaches the chuck 10 to its base or to a base which is a part of the apparatus on which the wafer is to be processed, e.g., the prober's chuck support structure top, which is shown in FIG. 3 in phantom and indicated by reference numeral 48. This vacuum attachment assembly will be described below in detail.

As mentioned above, the lower surface of the heat sink 14 can be formed with a plurality of support pegs or studs 40 which support the chuck 10 on the base 48. This base 48 can be either a bottom portion of the chuck 10 or a support structure that is part of the host apparatus, i.e., the prober. To provide the required mechanical support and simultaneously thermally isolate the chuck 10 from the host machine, the heat sink studs 40 rest on a matching plurality of thermally nonconductive elements 52 shown in FIGS. 2 and 3 in the form of upright posts, studs or rods. In one embodiment, these elements 52 are made of a thermally insulating material such as ceramic or glass. The thermally insulating support elements 52 can be of any suitable shape, such as cylinders, spherical balls or the rods shown and described herein. They can also be in any suitable orientation, e.g., upright, laying down, etc. The embodiment described herein uses rods in an upright position, but other shapes and orientations can be used. It should be noted that the elements shown in FIG. 2 include two sets of glass rods. One set of rods 52 is located under the studs 40 formed in the heat sink 14 as described herein. The second set of glass rods 54 shown in FIG. 2 is disposed in a ring surrounding the first set. This second set is used in the vacuum attachment assembly as described below to support the heat sink at its circumference on the base 48.

The lower support assembly 30 also includes one or more alignment pins 58 for aligning the upper support assembly 26 and lower support assembly 30 when they are assembled together. The alignment pins 58 can be press fit into the heat sink 14 and its cap 32. The pins can be slip fit into alignment holes in the upper assembly 26 and in the base 48. In one embodiment, two alignment pins 58 are used. The upper assembly 26 and base 48 each include a circular hole which receives an end of one of the pins. The opposite ends of the other pin are received in alignment slots in the upper assembly 26 and the base 48 which allow the relative positions of the base and chuck to be adjusted. That is, the relative positions can change to accommodate relative radial expansion and contraction. However, relative rotation is prevented as is movement between centers.

The lower support assembly 30 also includes a lower insulation plate 22 between the heat sink/heater combination and the base 48. The lower plate 22 provides additional thermal insulation and can be formed with a plurality of clearance holes for the thermally insulating elements 52 and the alignment pins 58. The lower base 48 can also include means for circulating fluid through the base 48 to cool or control the temperature of the base 48. This establishes a thermal barrier between the chuck and the base to prevent heat flow between the chuck and the prober support structure.

As described above, the lower assembly 30 can also include a vacuum attachment assembly for attaching the chuck 10 to the base 48 and supporting the chuck 10 on the base 48. The vacuum attachment assembly includes the upper vacuum platform ring 44 and the lower vacuum attachment ring 50. The lower ring 50 includes two annular rings 60 and 62 opposed to each other and spaced apart from each other by a plurality of thin-walled, insulating tubes 66 which can be formed of a low-thermally-conducting metal such as stainless steel. In one embodiment, twenty-four tubes evenly spaced around the rings 60 and 62 are located coaxially with twenty-four holes 68 in ring 60 and twenty-four aligned holes 70 in ring 62. Each of the holes 68 and 70 includes a counterbore 69 and 71, respectively, in which an end of a tube 66 is located. The tubes 66 are attached in position by oven brazing, soldering or similar process to assemble the two rings 60 and 62.

Each of the rings 60, 62 includes a pair of annular channels formed on opposite sides of the ring of holes 68, 70. The ring 60 includes two annular channels 76 and 78 on opposite sides of holes 68, and ring 62 includes channels 80 and 82 on opposite sides of holes 70. Each channel has inserted therein an o-ring for providing a vacuum seal for its respective ring 60, 62. Specifically, channels 76 and 78 include o-rings 84 and 86, respectively, for sealing ring 60 to the bottom surface of the upper vacuum platform ring 44. Channels 80 and 82 include O-rings 88 and 90, respectively, for sealing ring 62 to the base 48. The lower vacuum attachment ring 50 also includes a vacuum port 92 for applying a vacuum to the vacuum attachment assembly to hold the chuck 10 to the base 48. When the vacuum is applied at the vacuum port 92, the lower support assembly 30 is held to the base 48.

As noted above, a second set of rods 54 of a thermally insulating material such as ceramic or glass are used as part of the vacuum attachment assembly to support the chuck 10 on the base 48. Each of the rods 54 is located within an associated pair of holes 68, 70 and stainless steel tube 66. When the vacuum is applied, the surface of the upper vacuum platform ring 44 and the base 48 are pulled against the rods 54 between them. The o-rings 84, 86, 88 and 90 provide the vacuum seal that permits attachment and the rods provide the mechanical support.

Figure 4:
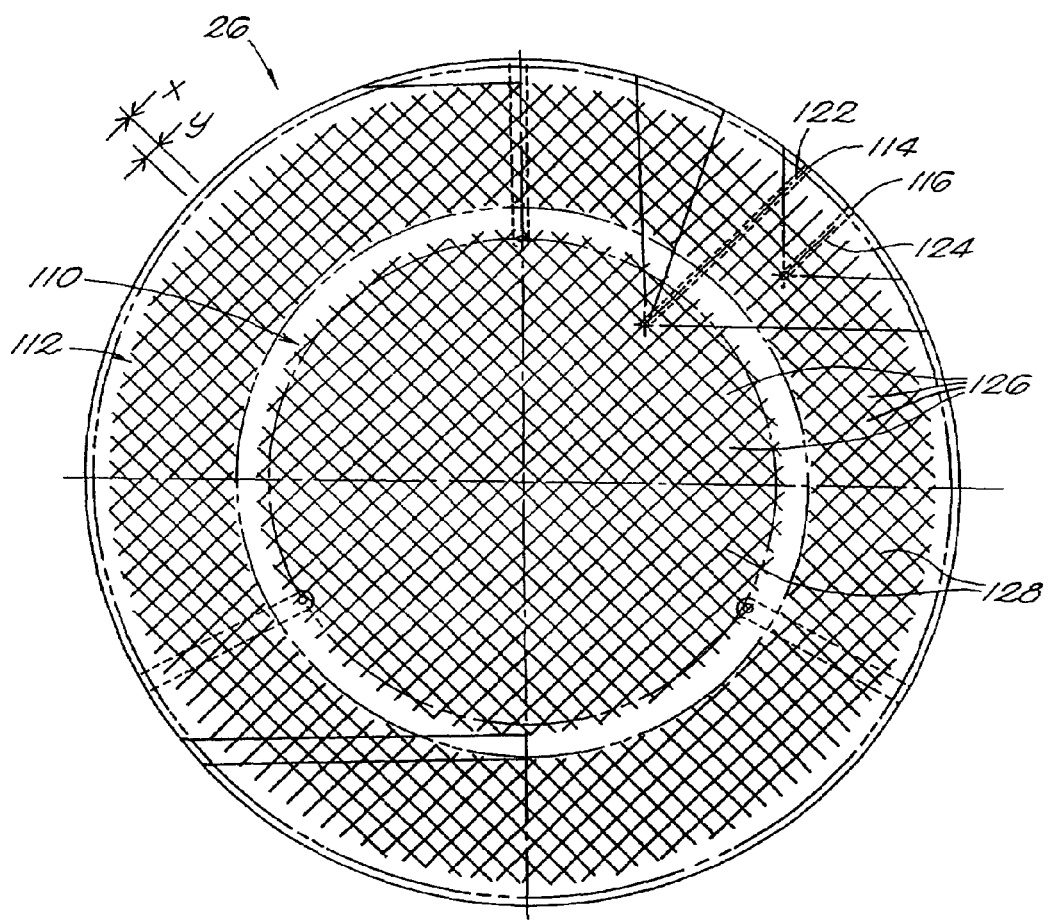
FIG. 4 is a schematic diagram of the top surface of the chuck of the invention showing a vacuum distribution pattern used to hold a flat workpiece.

FIG. 4 is a schematic plan view of the upper assembly 26 of the chuck 10 of the invention showing one embodiment of the vacuum distribution pattern on the top surface 12 of the chuck 10. As shown, the pattern actually can include two patterns, an inner pattern 110 and an outer pattern 112, each with its own vacuum connection port 114 and 116, respectively. The ports 114 and 116 are connected by channels 122 and 124, respectively, to vacuum patterns 110 and 112, respectively. The inner and outer patterns allow the chuck 10 to accommodate wafers of different diameters. For example, in one embodiment, the chuck 10 may be used for either eight-inch wafers or twelve-inch wafers. When an eight-inch wafer is used, vacuum is supplied through port 114 only to activate only the inner vacuum pattern 110. When a twelve-inch wafer is used, vacuum is supplied to both vacuum ports 114 and 116 to activate both vacuum patterns 110 and 112.

Each vacuum pattern 110, 112 can include a rectangular grid of raised rectangular regions 126 separated by channels or grooves 128. A wafer being held to the chuck rests on the raised rectangular regions 126 while vacuum within the channels 128 holds the wafer down. The width of a channel 128 is represented in FIG. 4 as x, and the distance between channels is represented as y. In one embodiment, x=0.025 inch and y=0.250 inch. In another embodiment, x=0.050 inch and y=0.100 inch. Many other dimensions can be used.

The vacuum patterns can be formed by one of several possible approaches. In one embodiment, the patterns are formed by grinding the channels 128 into the surface of the substrate, leaving the raised regions 126 between them. The surface can then be coated with a conductive metallic material. In another embodiment, a uniform layer of metal is deposited onto the top surface of the substrate, and then the pattern of channels is etched into the metal, leaving a pattern of raised rectangular metallic pads. In another embodiment, the raised regions are formed by depositing the array of rectangular metallic pads onto the ceramic substrate, leaving the channels between the pads. To provide electrical conduction between the chuck and the wafer, a thin layer of metal can be added on top of the patterned vacuum distribution layer. Any of the metallic layers can be deposited by a process such as silk screening, plating, sputtering or brazing.

Figure 5:
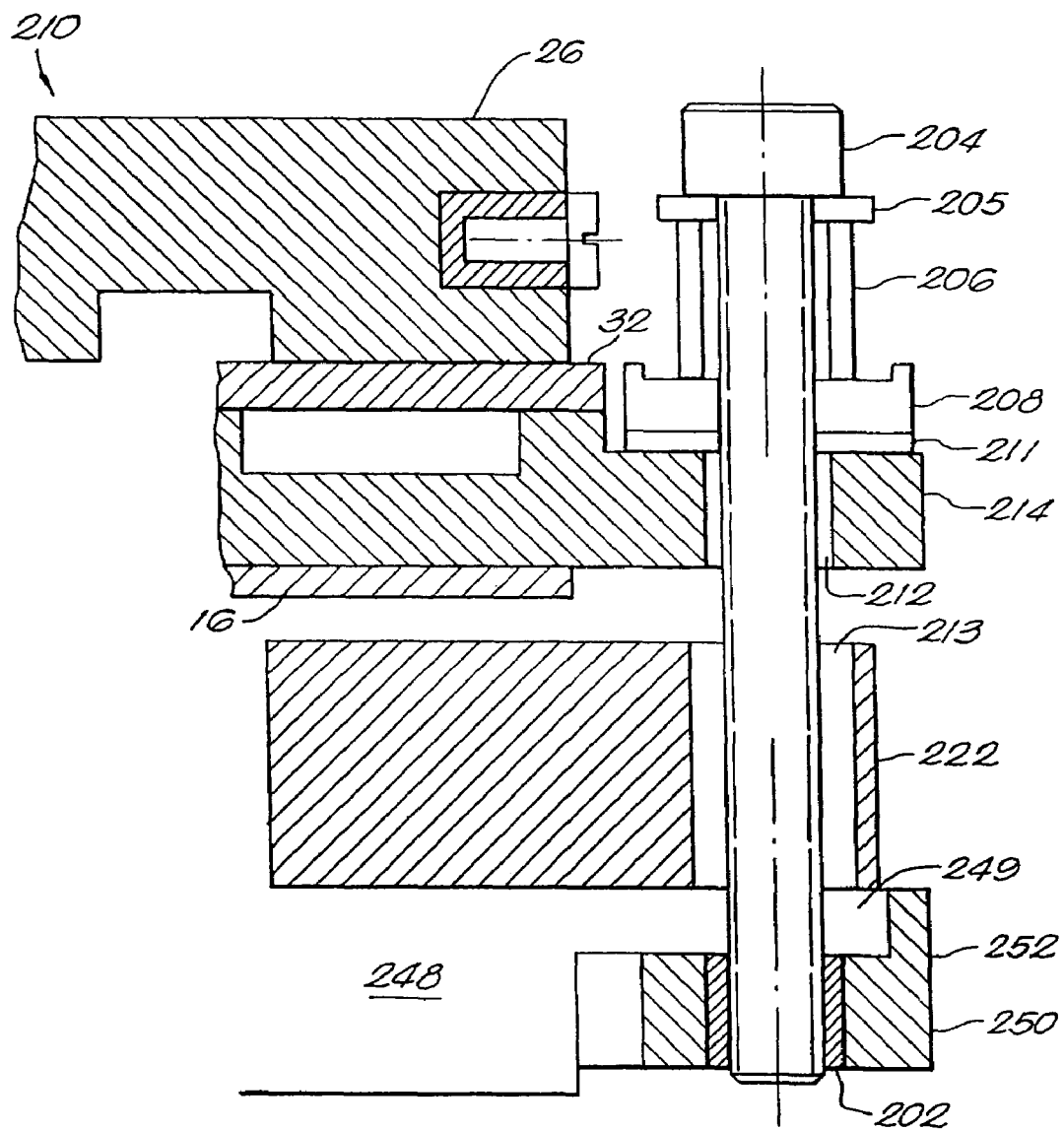
FIG. 5 is a schematic partial cross-sectional view of an alternative embodiment of the workpiece chuck of the invention using springs to hold the chuck together.

As mentioned above, the upper and lower supports or assemblies of the invention can also be held together by spring force. FIG. 5 is a partial schematic cross-sectional view of an alternative embodiment 210 of the chuck of the invention using springs to hold the chuck together. FIG. 5 shows only the portions of the chuck 210 required for the description of the alternative embodiment of the invention. It will be understood that other elements of the chuck 210 are similar to the corresponding elements described in detail above in connection with FIGS. 2 and 3.

The chuck 210 includes the upper support or assembly 26 held by vacuum to the conductive cap 32 on the heat sink 214. The heater 16 is intimately attached to the bottom of the heat sink 214 by some intimate attachment means such as adherence by vulcanization or epoxy bonding. The chuck 210 is mounted to a host machine by a base 248, and a lower support plate 222 is disposed between the base 248 and the upper portions of the chuck 210.

The base 248 includes an annular flange 249 which forms the circumferential edge of the base 248. A lower mounting ring 250 is located under the flange 249. A bolt 204 holds the lower assembly of chuck 210 together. The bolt 204 extends through oversized clearance holes 212 and 213 in the heat sink 214 and lower support plate 222, respectively, and is threaded into a threaded hole 202 in the lower mounting ring 250.

The lower assembly of chuck 210 is held together by spring force which is provided by a partially compressed coil spring 206 captured between a flat washer 205 and a capturing cup element 208. A TEFLON® washer 211 is provided between the cup element 208 and the heat sink 214 to allow the chuck parts to slide relative to each other in response to differential temperature effects and to provide thermal insulation between the heat sink 214 and base 248. The oversized clearance holes are also provided to allow the chuck parts to move relative to each other and for thermal isolation. Thus, chuck and workpiece distortions due to differential temperature effects are substantially eliminated.

Figure 6:
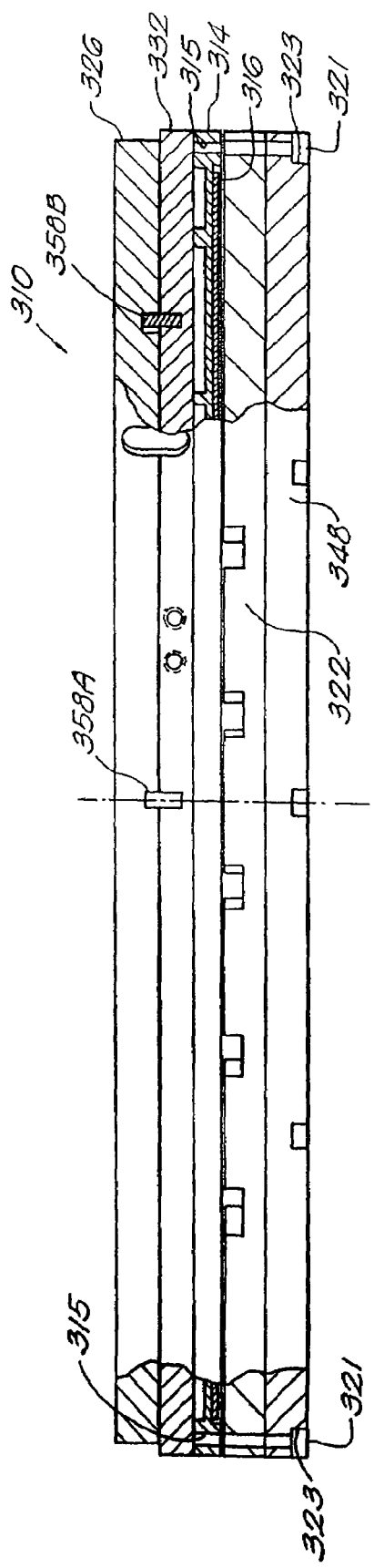
FIG. 6 is a schematic partial cross-sectional view of another alternative embodiment of the workpiece chuck of the invention.

FIG. 6 is a schematic partial cross-sectional view of another alternative embodiment 310 of the workpiece chuck of the invention. This embodiment of the chuck 310 includes a top assembly 326 mounted over a heat sink 314 which is covered by a conductive cap or cover 332 secured to the heat sink 314 by brazing or other known process. The heater 316 is adhered to the bottom of the heat sink 314 by some process such as vulcanization or epoxy bonding. The heat sink 314 and heater 316 are mounted over a support plate 322 which is mounted on the base 348. Two alignment pins 358A and 358B are attached to the cap 332 by press fit into corresponding holes or by brazing or other attachment process. Free ends of the alignment pins 358A and 358B protrude into alignment holes in the upper assembly 326. The central alignment hole, which receives pin 358A, can be circular to provide a slip fit with the free end of the alignment pin 358A. The other hole, which receives alignment pin 358B, can be elongated to allow for radial movement caused by differential temperature effects while preventing rotation between parts of the chuck 310.

In this embodiment, the base 348 can be attached to the heat sink 314 by bolts 321 which are secured in threaded holes 315 in the heat sink 314. To provide non-constraining attachment in accordance with the present invention, a resilient spring-type washer 323 can be used with each bolt 321. In one embodiment, the resilient or spring washer 323 is a belleville washer. The torque applied to the bolts 321 to tighten them is sufficient to partially compress the washers 323 such that sufficient force is applied to hold the chuck together under expected accelerations. However, the applied torque is also low enough such that the forces holding the chuck 310 together can be overcome by expansion forces caused by thermal effects. As a result, the chuck layers can move relative to each other in a substantially continuous fashion under thermal expansion forces while being held together against accelerations. The base 348 can be bolted to the host machine to hold the chuck 310 on the prober support structure.

Figure 7:
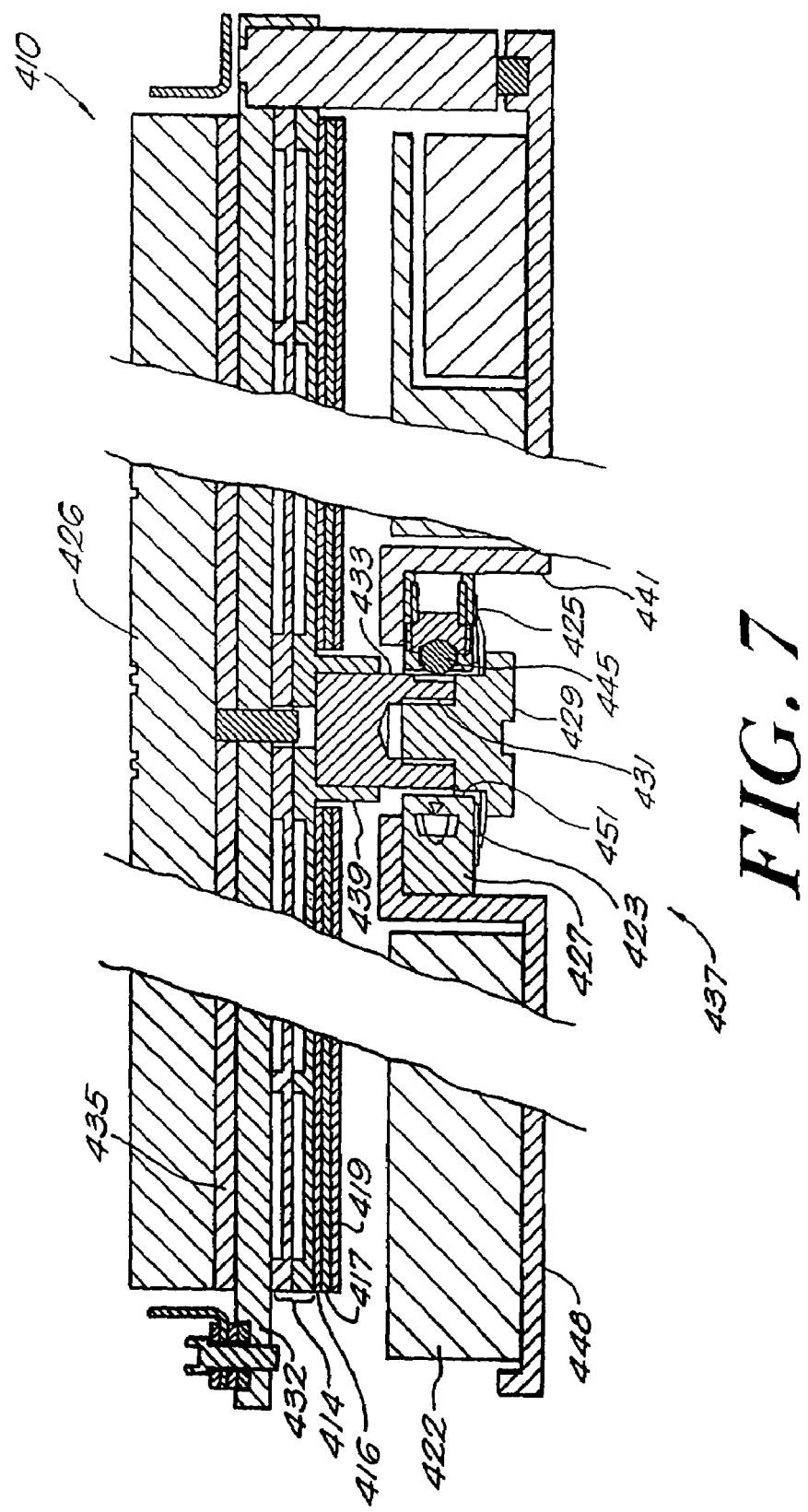
FIG. 7 is a schematic cross-sectional view of another alternative embodiment of the workpiece chuck of the invention.

FIG. 7 is a schematic cross-sectional diagram of another alternative embodiment 410 of the chuck of the invention. The chuck 410 includes a top assembly 426 which is mounted over an insulation layer 435. A heat sink 414 is covered by a conductive upper cap 432 which is attached by brazing or other process. A resilient, compressible (spring-like) insulating paper 417 is applied to the bottom of the heater 416, and a metallic backing plate 419, made of a material such as stainless steel, is attached to the bottom of the resilient paper 417 by screws (not shown) which pass through the paper 417 and the backing plate 419 and thread into the heat sink 414, thus attaching the heater 416 to the bottom surface of the heat sink 414. The upper components of the chuck 410 are mounted over the lower support plate 422 and the base 448, which can be attached to the host machine by bolts (not shown).

Figure 8:
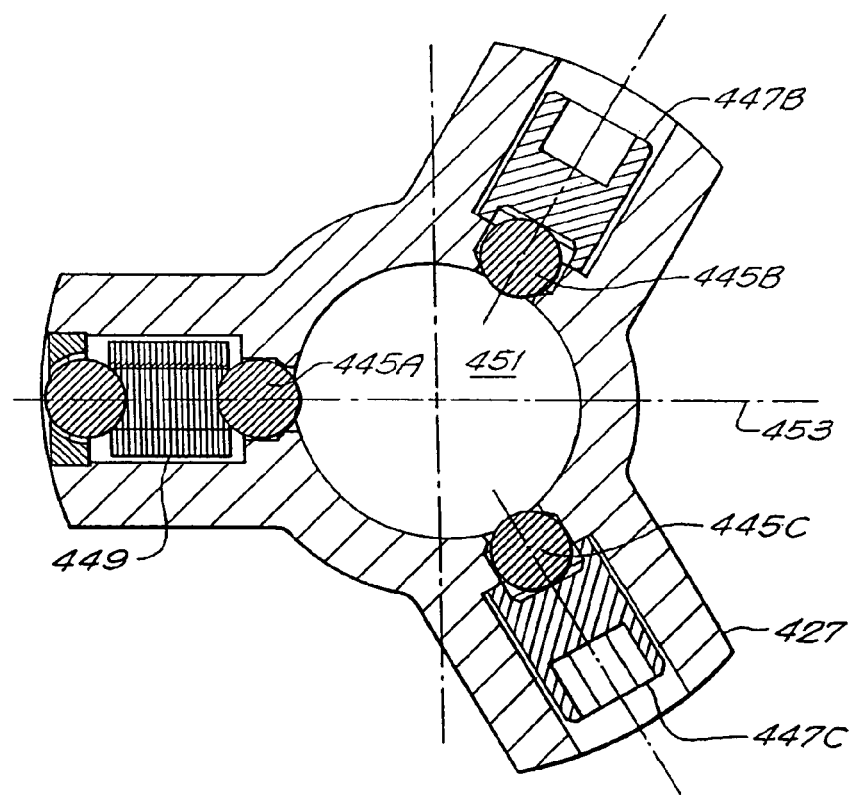
FIG. 8 is a schematic cross-section of a three-point attachment member in accordance with the present invention.

The upper portion of the chuck 410 is attached to the base 448 by an attachment mechanism 437. The attachment mechanism 437 includes a boss 439 which is integrally formed as part of the bottom of the heat sink 414. An insert 433 is fixedly mounted such as by brazing in the inside of the boss 439. A three-point attachment member 427, as detailed in FIG. 8, is fixedly mounted in a recess 441 in the base 448. The three-point member 427 includes a hole 451 which provides clearance for the insert 433 when the chuck 410 is assembled. A threaded screw 429 is threaded into threaded hole 431 in the insert 433. The screw 429 provides attachment force against a resilient washer 423 which can be a belleville washer. The resilient washer 423 is mounted over a flat washer 425, which can be made of an insulating material such as a ceramic to reduce heat flow between the chuck 410 and the prober machine. The screw 429 is tightened such that spring force provided by the spring washer 423 is applied to hold the upper portion of the chuck 410 to the base 448. The three-point attachment member 427 and the spring attachment using the screw 429 and resilient washer 423 provide sufficient force to hold the chuck 410 together on the base 448 under accelerations due to positioning motions while allowing relative movement between the base 448 and the upper portion of the chuck 410 caused by thermal expansion forces such that distortions caused by differential temperature effects are substantially eliminated.

FIG. 8 is a schematic detailed cross-sectional view of the three-point attachment member 427. The attachment member includes two stationary spherical contact balls 445B and 445C which contact the insert 433 when the chuck 410 is assembled. The stationary balls 445B and 445C are held in stationary position by adjustable set screws 447B and 447C, respectively. Spherical ball 445A is moveable against coil spring 449 such that motion along the axis 453 is permitted such that chuck layers can move relative to each other under thermal expansion forces.

Figure 9A:
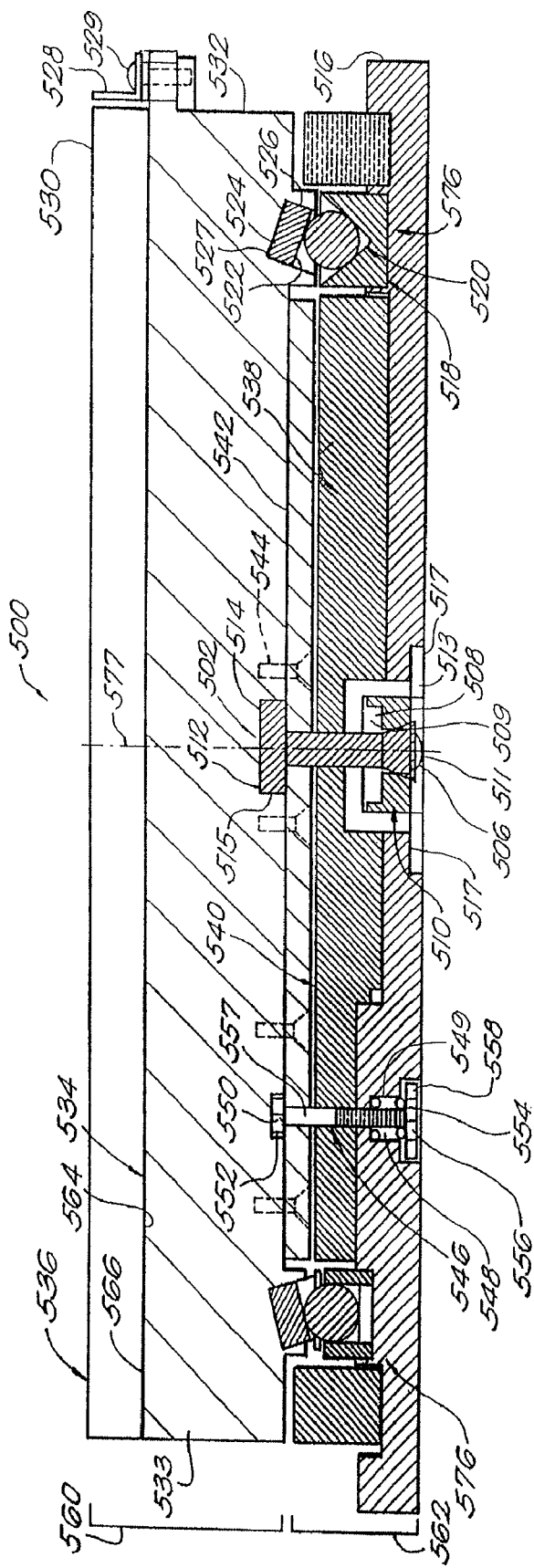
FIG. 9A is a schematic partial cross-sectional view of another alternative embodiment of a workpiece chuck in accordance with the present invention.

FIG. 9A is a schematic partial cross-sectional view of another alternative embodiment of a workpiece chuck in accordance with the present invention. The chuck 500 includes an upper portion 560 which includes a top assembly 530, a guard layer 534 and a heat sink/heater assembly 532. The top assembly 530 is made of ceramic, quartz or other similar electrically isolating material, which in turn can be metallized on its surface such as by sputtering or plating for good electrical contact to the back side of the wafer, and is held stationary with respect to the heat sink/heater assembly 532. Alternatively, if high isolation is not required, the heat sink/heater top surface can serve as the wafer support surface. The guard layer 534 can be disposed between the top assembly 530 and the heat sink/heater assembly 532. Contact can be made to the guard layer 534 via an electrode 528 attached to the guard layer 534 by a screw 529.

The heat sink/heater assembly 532 and the top assembly 530 can be held together by vacuum, in one embodiment. Additionally, the workpiece or wafer can be held to the top surface 536 of the top assembly 530 by vacuum. In one embodiment, two separate vacuum systems are used, a first vacuum system for holding the chuck together and the second vacuum system for holding the workpiece to the top surface 536 of the chuck. To hold the guard layer 534 to the heat sink/heater assembly 532, the assembly 532 can have a vacuum distribution pattern 564 formed on its top surface. The substantially uniform and smooth lower surface of the guard layer 534 is held to the top of the heat sink/heater assembly 532 upon activation of the vacuum system.

The guard layer 534 can also include a vacuum distribution pattern on its top surface 566 to distribute vacuum of the first vacuum system across its surface to hold the top assembly 530 to the top of the guard layer 534. The guard layer therefore includes a pattern of holes from its bottom surface to its top surface which transfer vacuum up through the guard layer 534 to the vacuum distribution pattern on its top surface 566. The vacuum distribution pattern formed on the top surface 566 of the guard layer 534 preferably includes a pattern of conductive metallic material deposited on the guard layer such as by plating. The material can be copper or other conductive material. The heat sink/heater assembly 532, the guard layer 534 and the top assembly 530 all include a pattern of holes used to transfer vacuum of the second vacuum system to the top surface 536 of the chuck. The vacuum at the top surface 536 is distributed by a vacuum pattern formed on the top assembly 530 to hold the wafer to the top of the chuck 500.

The heat sink/heater assembly 532 includes a housing 533 which is made of a material such as cast aluminum. In one embodiment, the top surface can be coated or plated with a hard material such as a hard anodize. This prevents the material of the top of the heat sink/heater assembly 532 from being rubbed onto the guard layer 534 or other layer on top of the assembly 532 during the relative lateral movement caused by thermal expansion/contraction and/or other effects. Especially at high temperatures, the relatively soft aluminum of a cast heat sink/heater assembly can cause the layer in contact with the top surface of the assembly to become galled, i.e., coated with aluminum. The plating eliminates this effect. The use of a non-conductive plating such as hard anodize also enhances electrical isolation. Within the housing 533 are located heater coils for applying heat to the chuck 500 as well as circulating tubes for circulating fluid throughout the heat sink/heater assembly 532 which can be used to cool the chuck 500.

The upper portion 560 is mounted over a lower portion 562 of the chuck 500. The lower portion 562 can include an insulating plate 538 made of a material such as a ceramic or quartz or other similar material. A reflective foil 540 can be formed over the lower insulating plate 538 to provide additional thermal isolation between the upper portion 560 and the lower portion 562 of the chuck 500. The insulating plate 538 is mounted over a base or mounting plate 516 which can be a part of the chuck 500 or optionally is part of the host machine, e.g., prober.

The upper portion 560 of the chuck 500 is supported over the lower portion 562 by a plurality of support members 576. In one embodiment, three support members 576 are spaced evenly around the center 577 of the chuck 500 at an equal distance from the center 577 of the chuck 500. Therefore, in one embodiment, three support members 576 are spaced 120 degrees apart on a circle centered at the center 577 of the chuck 500.

As shown in one embodiment, each support member 576 includes a flat pad 524 resting on top of the curved surface of a spherical ball 520. The flat pad 524 is positioned within an inclined cavity 526 having an inclined inner surface 527 formed in the bottom of the heat sink/heater assembly 532. The spherical ball 520 rests within a conical seat member 518 which is mounted in stationary relation with the lower support plate 516. The ball 520 and the pad 524 are both preferably made from a hardened material, such as tungsten carbide or stainless steel. The hardened front surface 522 of each pad 524 rests on a surface of a ball 520.

Hence, the upper portion 560 of the chuck 500 rests on the lower portion 562 at essentially three contact points between hardened pads 524 and hardened spherical balls 520. Because the contact points are small and because the pads 524 and balls 520 are made of thermally insulating material, heat transfer between the upper portion 560 and the lower portion 562 of the chuck 500 is extremely limited. Also, the three-point contact system of inclined surfaces provides a high level of stability in the chuck 500, which resists relative tilting motion between the upper portion 560 and the lower portion 562. In another embodiment, more than three support members 576, e.g., six, can be used. The additional support members 576 are used to provide added support when needed, such as when the chuck is operated at elevated temperatures that cause one or more chuck layers to soften and change shape, or when significant vertical loads are applied to the chuck. To maintain the stability of the planar three-point support system, the additional support members are configured such that three support members maintain contact with the upper and lower chuck portions. For example, the spherical balls 520 of the additional support members can have slightly smaller diameters than those of the three principal support members. In this case, the three principal support members provide constant support. The additional supports become effective under special conditions such as elevated temperature or increased vertical load to provide support to maintain the top surface 536 of the chuck 500 very flat.

Each pad 524 is tilted with respect to horizontal along a line extending axially from the center 577 of the chuck 500 through the pad 524. The angle of incline is chosen based on several factors designed to ensure that the top surface 536 of the chuck 500 remains at a substantially constant height over a wide range of temperature. During temperature transitioning, the multiple components of the chuck 500 experience changes in shape and size due to thermal expansion and contraction effects. For example, as temperature increases, the heat sink/heater assembly 532 expands in both the horizontal and vertical directions. Without the support members 576 of the invention, the top surface 536 would rise as temperature increased and would fall as the temperature decreased, due to expansion and contraction in the vertical dimension. However, with the inclined pads 524 of the invention, the top surface 536 can be kept at a substantially constant height over temperature.

As the temperature of the chuck 500 increases, the upper portion of the chuck expands vertically and horizontally. As it expands horizontally, the front surfaces 522 of the inclined pads 524 slide along the spherical balls 520, which are maintained stationary with respect to the base 516 of the chuck 500. The incline angle resolves the horizontal expansion into a vertical drop of the entire upper portion 560 of the chuck. This vertical drop compensates for the vertical expansion in the upper portion 560 due to thermal effects. The result is that the top surface 536 and, therefore, the wafer being tested, are kept at a constant height. As a result, downward forces on the wafer and chuck, such as those applied by an integrated circuit or wafer prober, are maintained substantially constant. Also, contacts between the probes and the wafer are maintained more reliably, thus providing more accurate circuit test results.

The support members 576 of the invention provide wide functional flexibility in the chuck of the invention. The incline angle can be selected based on a variety of factors, such as the thermal expansion coefficients of the materials used to fabricate the chuck, the diameter of the chuck, the thicknesses of the various components, and the expected temperature range. The angle of incline can be selected such that, using a certain predetermined set of components of predetermined sizes and made of predetermined materials, and operating over a predetermined temperature range, the height of the top surface 536 can be maintained as constant as possible. All of these factors, and other factors, can be optimized to produce the desired result.

The surfaces 522 of the sliding pads 524 are maintained in contact with the surfaces of the spherical balls 520 by one or more hold-down assemblies 546. The hold-down assembly 546 includes a screw or bolt 557 captured at its head 550 in a cavity 552 formed in the bottom of the heat sink/heater assembly 532. A lower plate 542 having similar thermal expansion as the heat sink/heater assembly 532 is bolted onto the bottom of the heat sink/heater assembly 532 by multiple bolts or screws 544 to capture the head 550 of the screw 557 in the cavity 552. The screw 557 of the hold-down assembly 546 passes through clearance openings in the lower insulating plate 538 and in the base 516. A nut 556 is threaded onto the end of the screw 557 to hold the screw 557 in place. The nut tightens against a washer 554 in a counterbore 558 which compresses a spring 548 within a cavity 549 in the base 516. This spring capture attachment mechanism allows for free movement of the components of the chuck to prevent distortions introduced by rigid attachment.

In the chuck 500 of the invention, the upper portion 560 is maintained in central alignment with the lower portion 562 by an alignment hold-down assembly 502. The assembly 502 includes a pin or stud 514 having a head or flange portion 512 fixedly attached in an opening 515 on the bottom of the heat sink/heater assembly 532, such as by press fit, welding, brazing, soldering, etc. or a combination of those methods. The stud 514 passes through an opening in the lower plate 542 and the lower insulating plate 538 into a cavity 509 formed in a bushing 513 held in the base 516 by screws 517. A floating taper portion 510 is inserted into the bushing 513 over the end of the stud 514. A taper 506 is inserted into a matching tapered opening in the floating taper 510 and is captured at the end of the stud 514 by a screw 511 threaded into the end of the stud 514. A butterfly spring 508 is captured within the cavity 509 by the floating taper 510. Again, the spring force provides non-rigid mounting of the upper portion 560 of the chuck 500 with respect to the lower portion 562. As the chuck 500 expands, and/or contracts over temperature, the center of the upper portion 560 of the chuck is maintained in line with the center of the lower portion 562 by the centering alignment hold-down assembly 502.

Figure 9B:
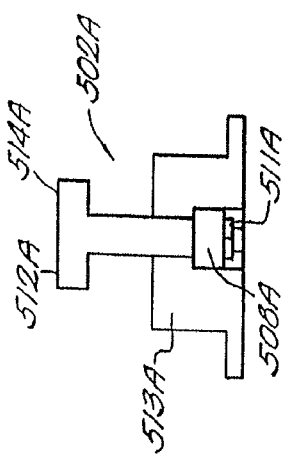
FIG. 9B is a schematic pictorial detail view of a mechanism for holding a chuck such as the chuck of FIG. 9A to a mounting plate in accordance with the present invention.

FIG. 9B is a schematic pictorial view of an alternative embodiment 502A of the centering alignment hold-down assembly of the invention. In the device 502A, the stud 514A is held at its flange portion 512A in the opening 515 in the bottom of the heat sink/heater assembly 532, as described above. The stud 514A passes through a bushing 513A held stationary within the base 516 by screws 517A (not shown). The stud 514A is held within the opening in the bushing 513A by a nut 511A threaded onto the end of the stud 514A. The nut captures one or more wave washers or spring washers 508A which compress when the nut 511A is tightened. The spring force of the washers 508A hold the upper portion 560 and lower portion 562 together in non-constraining fashion.

FIG. 10A is a schematic pictorial view of an alternative embodiment of a support member 576A in accordance with the present invention. The support member 576A includes a pad 524A fixedly attached within an inclined cavity 526A formed in the bottom of the heat sink/heater assembly 532. A substantially spherical ball 520A is held within a seat 518A fixedly mounted with respect to the base 516 and lower insulating plate 538. Preferably, the pad 524A and spherical ball 520A are made of a hardened material such as tungsten carbide or stainless steel. In this embodiment, the spherical ball 520A is formed with a flat region 521A on its surface which contacts the front surface 522A of the flat pad 524A. Upon expansion and contraction of the chuck components, the flat pad 524A slides in contact at its front surface 522A with the flat region 521A formed on the surface of the spherical ball 520A.

FIG. 10B is a schematic pictorial view of another alternative embodiment of a support member 576B in accordance with the invention. In this embodiment, a flat pad 524B is fixed within an inclined cavity 526B formed in the bottom of the heat sink/heater assembly 532. In this embodiment, the surface 522B of the pad 524B mates with and slides along a flat surface 521B formed at the end of a support rod 523B. This support rod 523B is fixed within a stationary seat 518B which is held stationary with respect to the base 516 and lower insulating plate 538. As the chuck expands and contracts over temperature, the flat surface 522B of the flat pad 524B slides over mating flat surface 521B at the end of the support rod 523B.

FIG. 11A is a schematic top view of one embodiment of the heat sink/heater assembly 532 in accordance with the present invention. The assembly 532 includes a housing 533 which encloses the components of the assembly 532. The assembly 532 includes heater coils used to heat the chuck 500 and workpiece. Also included in the assembly 532 is a tube 580 used to circulate fluid through the assembly 532. In one embodiment, the fluid enters the tube 580 at an inlet port 582 and circulates through the assembly 532 as shown. The fluid exits the assembly via an outlet port 584. In one embodiment, the tube 580 is flattened as shown in FIG. 11B, which is a schematic cross-sectional view of the tube 580. The tube is flattened such that the height of the tube 580 and, therefore, the height of the heat sink/heater assembly 532 and the overall height of the chuck 500 can be minimized. The heat sink/heater assembly 532 also includes one or more vacuum transfer hole patterns 586 and 588. The vacuum from the two individual vacuum systems of the invention is transferred through the heat sink/heater assembly via the vacuum hole patterns 586 and 588.

Figure 12:
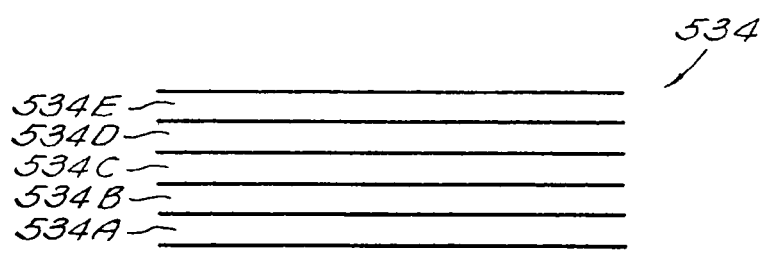
FIG. 12 is a schematic pictorial view of the cross-section of a portion of the chuck of FIG. 9A in accordance with the present invention.

FIG. 12 is a schematic illustration of the cross-section of one embodiment of a guard layer 534 in accordance with the invention. The guard layer 534 actually includes five individual layers 534A through 534E. In one embodiment, three conductive layers 534A, 534C and 534E are separated by two insulating layers 534B and 534D which are formed of an insulating material such as polyimide. The lower conductive layer 534A is substantially smooth and serves as the surface used to hold the guard layer 534 to the vacuum distribution pattern formed on the top of the heat sink/heater assembly 532. Layer 534C is substantially smooth and serves as the actual guard layer of the guard layer assembly 534. The electrical connection made via the electrode 528 (see FIG. 9A) is made through middle layer 534C. Layer 534E is also formed of a conductive material and preferably includes a vacuum distribution pattern used to distribute vacuum to hold the guard layer to the bottom of the top assembly 530 (see FIG. 9A) during use.

Figure 13:
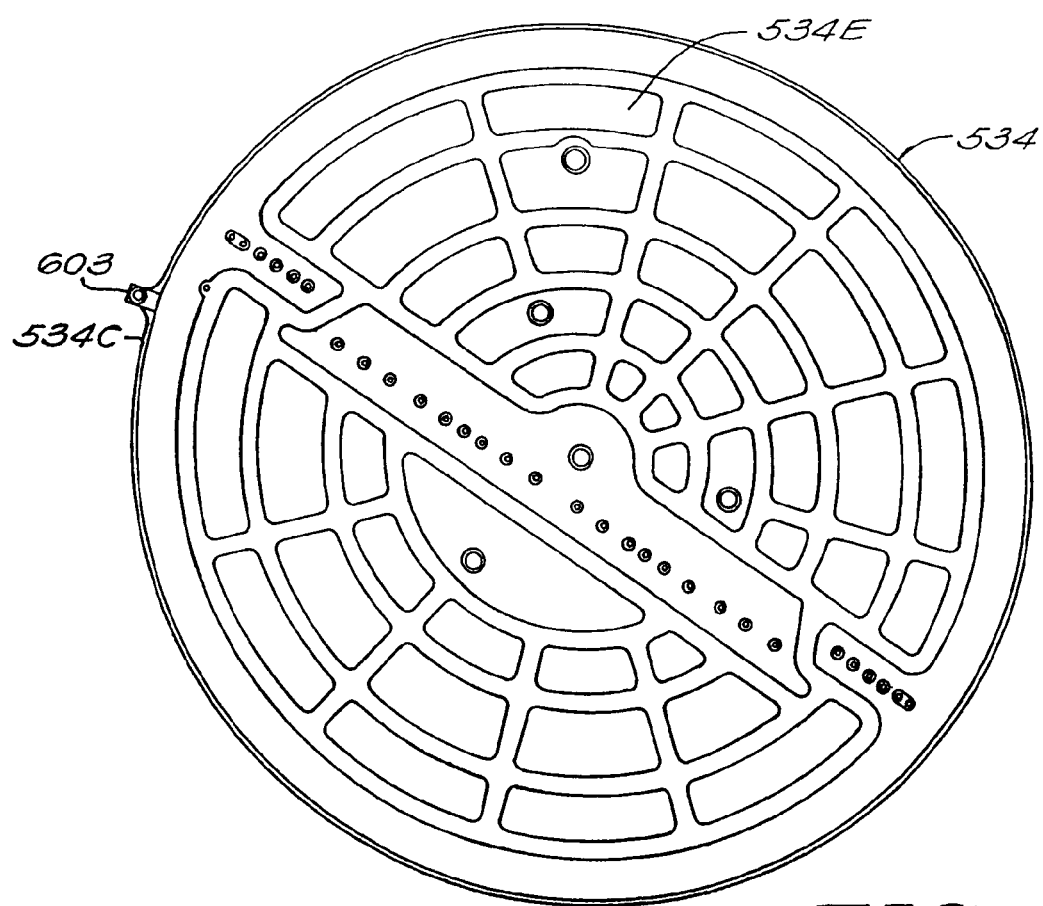
FIG. 13 is a schematic plan view of a vacuum pattern on one embodiment of an electrical guard assembly in accordance with the present invention.

FIG. 13 is schematic top view of the guard layer assembly 534 in accordance with the present invention. The assembly 534 includes a top layer 534E which includes a vacuum distribution pattern for holding the guard layer assembly 534 to the top assembly 530 of the chuck 500 (see FIG. 9A). A conductive tab 603 connected to the middle conductive layer 534C allows for electrical contact to the guard layer 534C. As shown, the guard layer assembly 534 also includes a series of holes used to transfer vacuum through the guard layer assembly up to and through the top assembly 530 such that the vacuum can hold the workpiece to the top surface 536 of the chuck 500.

Figure 14A:
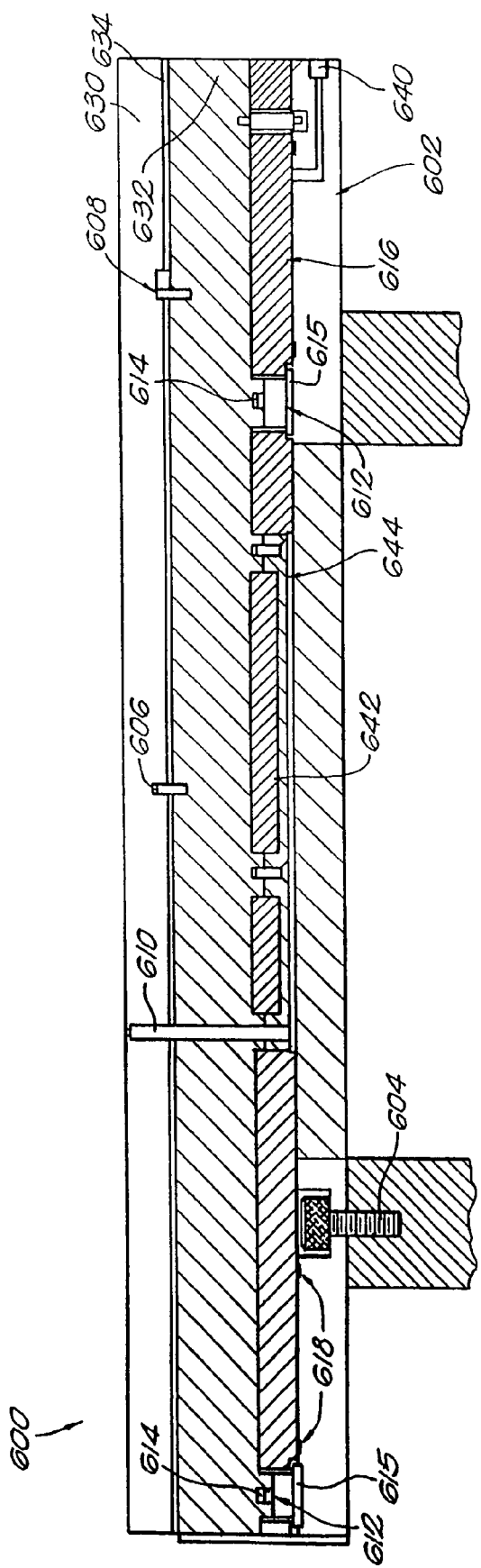
FIG. 14A is a schematic partial cross-sectional view of another alternative embodiment of a workpiece chuck in accordance with the present invention.

FIG. 14A is a schematic partial cross-sectional diagram of another alternative embodiment of a workpiece chuck in accordance with the present invention. The chuck 600 of FIG. 14A uses thermally insulating support posts 612, as described above in connection with FIGS. 1-3, to provide mechanical support and thermal isolation between the upper portion of the chuck 600 and the lower portion of the chuck, such that heat transfer between the chuck and the host machine is substantially reduced. The chuck 600 includes a top assembly 630 mounted to the top of the heat sink assembly 632. A guard layer assembly 634 can be located between the top assembly 630 and the heat sink assembly 632. Alignment pins 606 and 608 can be used as described above to prevent rotational movement between the top assembly 630 and the heat sink assembly 632 while allowing radial expansion and contraction due to temperature effects. Lift pins such as those identified by 610 are used to lift the wafer from the top of the top assembly 630.

The support rods 612 are attached to the bottom of the heat sink assembly 632 by threaded screws 614. The heads 615 of the support rods are captured by a retaining plate 616. The retaining plate 616 is pulled down to the lower support surface 602 by vacuum applied via a vacuum port 640. Annular seals 618 seal the vacuum within the region between them such that the vacuum holds the retaining plate 616 to the lower support surface 602. The lower support surface 602 is bolted to the host machine by bolts 604. When vacuum is applied, the retaining plate 616 is pulled down against the seals 618. It pulls the support rods by their heads 615 down onto the lower support surface 602. A ceramic insulating paper 642 and an insulating tape 644 such as KAPTON® polyimide film can be applied as shown to provide additional thermal isolation between the upper and lower portions of the chuck 600.

Figure 14B:
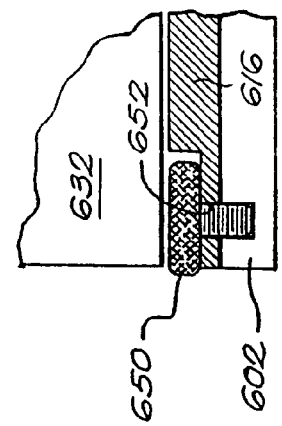
FIG. 14B is a schematic pictorial view of a manual hold-down device which can be used to hold the chuck of FIG. 14A onto a lower support surface in accordance with the present invention.

FIG. 14B is a schematic pictorial view of a manual hold-down assembly which can be used to manually temporarily hold the chuck of FIG. 14A to the lower support surface 602. The manual hold-down assembly is used to temporarily manually clamp the retaining plate 616 to the lower support surface 602 before the vacuum is applied to hold the chuck together during operation. The assembly includes a thumb screw 650 which passes through a clearance hole 652 and threads into the lower support surface 602. During operation, when the chuck is first placed on the lower support surface 602, the retainer plate 616 is positioned on the lower support surface 602, and the thumb screw 650 is tightened to make the vacuum seal formed by the annular seals 618. Thereafter, the vacuum can be applied to pull the chuck together.

After the vacuum is applied and the annular seals 618 flatten as shown in FIG. 14A, the thumb screw 650 can be further tightened such that if vacuum is ever lost or temporarily disconnected, the chuck 600 will remain in position by the manual hold-down assembly until vacuum is reapplied. It should be noted that multiple manual hold-down assemblies are used around the circumference of the retainer plate 616.

Figure 15:
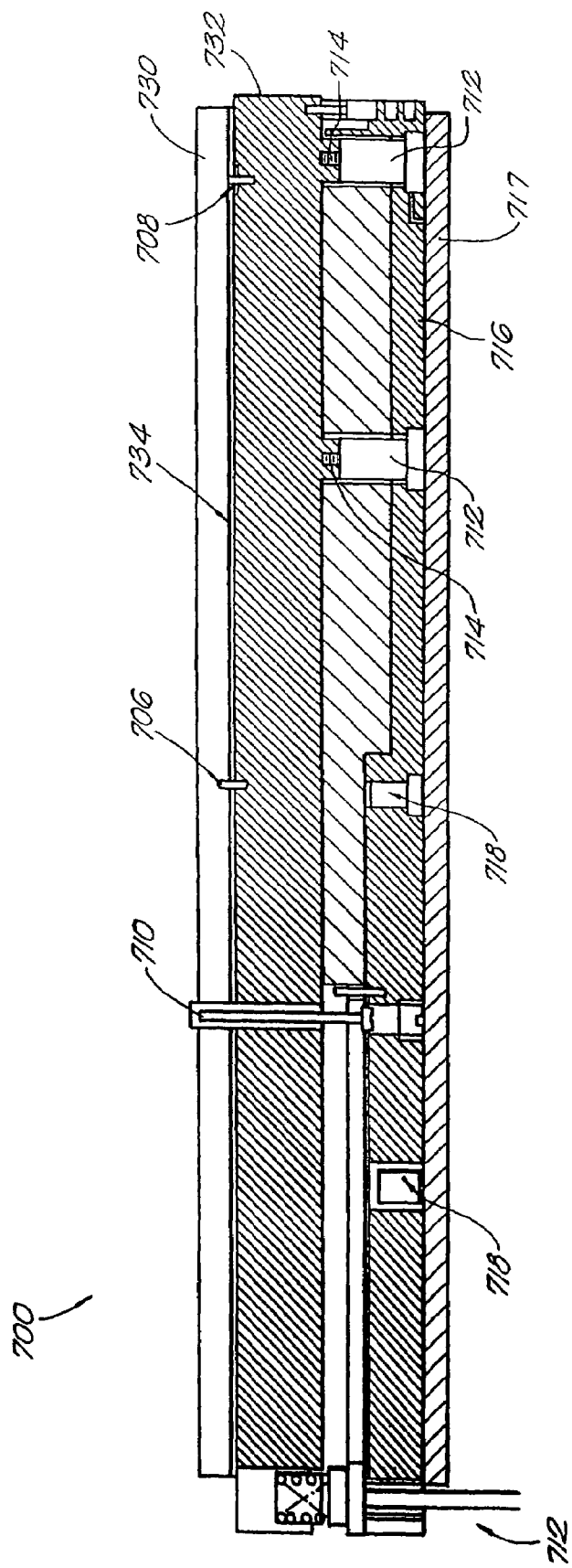
FIG. 15 is a schematic partial cross-sectional view of another alternative embodiment of a workpiece chuck in accordance with the present invention.

FIG. 15 is a schematic partial cross-sectional view of another alternative embodiment of a chuck 700 in accordance with the present invention. The chuck 700 includes lift pins such as those identified by 710 used to lift the workpiece off the top surface of the chuck 700. The lift pin actuation mechanism 712 is located at the outside edge of the chuck 700. The chuck 700 includes a top assembly 730, a guard layer 734 and a heat sink assembly 732. As in the previously described embodiment, thermally insulating support rods 712 are attached to the bottom of the heat sink assembly 732 by screws 714. Alignment pins 706 and 708 provide alignment as described above. In this embodiment, a lower thermally insulating stage plate 717, which can be made of an insulating material such as glass, quartz, ceramic, etc, is mounted on the host machine. The insulating support rods 712 rest on the insulating stage plate 717. The retaining plate 716 captures the heads of the support rods 712 to hold the upper portion of the chuck down to the stage plate. As in the previously described embodiments, the retainer plate 716 is held to the stage plate 717 by vacuum (not shown). Multiple thermally insulating guide pads 718, made of a thermally and electrically insulating material such as glass, quartz, ceramic, etc, are positioned under the retainer plate 716 on the stage plate 717 and provide relative rotational orientation between the retainer plate 716 and the stage plate 717 while permitting radial expansion and contraction.

Figure 16:
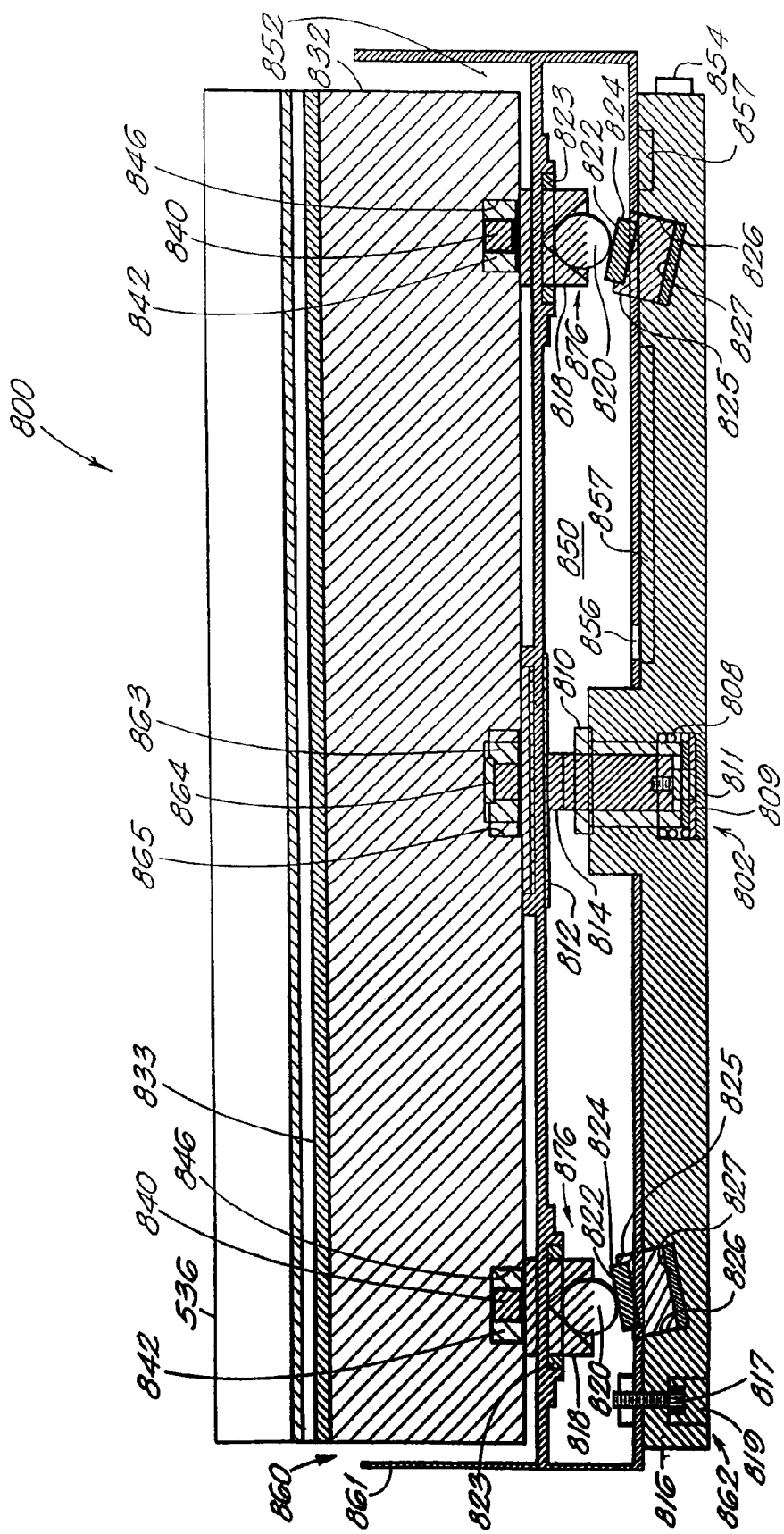
FIG. 16 is a schematic partial cross-sectional view of another alternative embodiment of a workpiece chuck in accordance with the invention.

FIG. 16 is a schematic pictorial partial cross-sectional view of a portion of another alternative embodiment of a workpiece chuck in accordance with the present invention. The chuck 800 of FIG. 16 contains an alternative support member configuration to that shown in FIGS. 9A-9B and 10A-10B. The features of the chuck 800 shown in FIG. 16 are applicable as appropriate to all of the chuck embodiments described herein. The chuck 800 of FIG. 16 will be described in terms of those of its features that are different from those of the other chuck embodiments described herein. Description of features of the chuck 800 that are implemented in one or more of the other chuck embodiments described herein is omitted.

The chuck 800 of FIG. 16 implements a different support member 876 configuration than that used in the chuck of FIGS. 9A, 9B, 10A and 10B. Specifically, in the embodiment of FIG. 16, the spherical balls 820 or other contact surface is at the bottom end of the support member 876 which in turn is attached to the upper portion 860 of the chuck 800, and the inclined surfaces against which the spherical balls 820 move are attached to the lower portion 862 of the chuck 800. The following description describes the support members 876 in terms of the use of spherical balls 820 and inclined surfaces 822. It will be understood that the invention is applicable to any of the other support member configurations described herein, specifically, those described in connection with FIGS. 9A, 10A and 10B. That is, the support members 876 used in the chuck 800 of FIG. 16 can include spherical balls, spherical balls with flat surfaces or support rods with flat surfaces that mate with the inclined surfaces of pads. In addition, the support rods or spherical balls can be mounted in a flat rectangular stationary seat or a conical seat.

In the embodiment 800 shown in FIG. 16, the spherical balls 820 are mounted within a stationary conical seat 818 which is attached within the bottom of the heat sink/heater assembly 832. A stud portion 840 at the top of the seat 818 is fit such as by press fit within a bushing 842 made of a relatively hard non-conductive material such as stainless steel. The bushing is inserted within an opening 846 in the bottom of the heat sink/heater assembly 832. The stainless steel bushing provides stability and support to the conical seat 818 over the wide range of operational temperatures of the chuck 800. In one embodiment, the housing of the heat sink/heater assembly 832 is made of cast aluminum and, therefore, at elevated temperatures tends to soften. The stainless steel bushing 842 provides stability and rigid attachment for the conical seat 818 such that inadvertent movements due to softening of material over temperature is substantially eliminated. The conical seat 818 can also be made of an insulating material such as stainless steel such that heat transfer between the heat sink/heater assembly 832 and the spherical ball 820 is substantially reduced.

The spherical ball 820 rests on the surface 822 of an inclined pad 824, which is mounted in a stationary fashion to the end of a stud 825 within a cavity 826 formed in the lower support plate 816. The stud 825 and therefore the pad 824 and surface 822 are mounted at an incline defined by the inclined bottom surface 827 and walls of the inclined cavity 826. As described above, the angle of incline is selected based on various factors including thermal expansion coefficients and required operational temperature ranges.

This configuration of the support member 876 provides improved performance over temperature. The pads 824 are mounted in the lower support plate 816 and are therefore maintained at or close to room ambient temperature. Also, the spherical balls 820 are isolated from the heat sink/heater assembly 832 by the conical seat member 818. Therefore, heat flow to the spherical balls 820 and/or the pads 824 is substantially reduced. The chuck 800 can also include an enclosure 861 which provides a heat flow "swirl" chamber 850 in the region between the heat sink/heater assembly 832 and the lower support plate 816. Air or other cooling fluid can be circulated through the lower support plate 816 via a valve or inlet 854. Fluid passages 857 route the air from the inlet 854 to the outlet hole 856 to allow the air to circulate through the chamber 850. The air circulates through the region to maintain the support members 876 at a relatively cool temperature. The air can pass through a porous fiber ceramic gaskets 823 surrounding the conical seat member 818, and can pass out of the enclosure 861 through a space 852.

The improved temperature operating conditions of the support members 876 allows for selection of spherical ball and pad materials which provide improved performance. For example, the balls and/or pads can be made of silicon nitride or alumina which can be highly polished to allow for smooth movement during expansion and contraction over temperature. These balls and pads are also highly insulating both electrically and thermally, resulting in much improved performance.

The enclosure 861 can be made of a material such as stainless steel which has a relatively low emissivity. The highly reflective outside surface of the enclosure 861 allows the enclosure to act as a heat shield. Also, the enclosure 861 can be made to extend to the top of the chuck 800 such that it can be electrically grounded and it can serve as an EMI shield. The heat shield enclosure 861 can be secured to the lower support plate 816 by multiple screws 817 in counterbored cavities 819 formed in the lower support plate 816.

In one embodiment, the heat sink/heater assembly 832 includes a hard coating 833 such as a hard anodize which prevents the relatively soft cast aluminum material of the heat sink/heater enclosure from rubbing off onto mating upper chuck layers during expansion and contraction during temperature transitions.

The chuck 800 of FIG. 16 also includes an improved alignment hold-down assembly 802 which applies clamping force to hold the upper portion 860 of the chuck 800 onto the lower portion 862 in a non-constraining fashion in accordance with the invention. The hold-down assembly 802 maintains contact between the spherical balls 820 and the inclined surfaces 822 of the support members 876 such that during expansion and contraction over temperature, the surfaces of the balls 820 and the inclined surfaces 822 move relative to each other to maintain the top surface of the chuck at a constant height, in accordance with the invention. The hold-down assembly 802 includes a stud 814 secured to the bottom surface of the heat sink/heater assembly 832. A large flange area 812 is mounted in a stationary fashion to the bottom surface of the heat sink/heater assembly 832 by fastening means such as screws (not shown). An end region 864 of the stud 814 is press fit within a stainless steel bushing 863 which is mounted within an opening 865 in the bottom of the heat sink/heater assembly 832. The large flange 812 in combination with the end portion 864 of the stud 814 within the bushing 863 provides an extremely secure and stable mounting of the stud 814 to the bottom of the heat sink/heater assembly 832.

The lower portion of the stud 814 passes through an electrically and thermally insulating bushing 810 to the lower plate 816. A bolt or screw 811 is threaded into a threaded hole in the bottom of the stud 814. The screw 811 tightens against an insulating washer 809 which compresses a captured spring 808 to secure the upper and lower portions of the chuck together in a non-constraining fashion.

This hold-down assembly 802 prevents the upper and lower chuck portions from sliding with respect to each other during temperature transistioning. The relative sliding between the chuck components due to thermal expansion and contraction is permitted such that the spherical balls 820 can move relative to the inclined surfaces 822. However, the centers of the upper and lower portions of the chuck 800 are maintained stationary with respect to each other by the hold-down assembly 802.

While this invention has been particularly shown and described with references to preferred embodiments thereof, it will be understood by those skilled in the art that various changes in form and details may be made therein without departing from the spirit and scope of the invention as defined in the following claims.

What is claimed is:

1. A method of manufacturing a workpiece chuck comprising:
    providing an upper portion on which the workpiece can be mounted;
    providing a lower portion by which the chuck can be mounted to a base;
    providing a temperature control device in thermal communication with the upper portion for altering the temperature of the workpiece;
    casting a housing of said temperature control device, the housing being separate and distinct from the upper portion; and
    forming a coating directly on an upper surface of said housing with a hard material to prevent cast material of the housing from rubbing off of the housing and onto a chuck layer in contact with the upper surface of the housing.

2. The method of claim 1 wherein the hard material comprises a hard anodize.

3. The method of claim 1 wherein the temperature control device comprises a heat sink.

* * * * *